United States Patent
Shah et al.

(10) Patent No.: US 12,210,857 B2
(45) Date of Patent: Jan. 28, 2025

(54) HEAD OF LINE BLOCKING MITIGATION IN A RECONFIGURABLE DATA PROCESSOR

(71) Applicant: SambaNova Systems, Inc., Palo Alto, CA (US)

(72) Inventors: Manish K. Shah, Austin, TX (US); John Philipp Baxley, Arlington, VA (US)

(73) Assignee: SambaNova Systems, Inc., Palo Alto, CA (US)

( * ) Notice: Subject to any disclaimer, the term of this patent is extended or adjusted under 35 U.S.C. 154(b) by 30 days.

(21) Appl. No.: 18/107,613

(22) Filed: Feb. 9, 2023

(65) Prior Publication Data

US 2023/0251839 A1    Aug. 10, 2023

Related U.S. Application Data

(60) Provisional application No. 63/349,733, filed on Jun. 7, 2022, provisional application No. 63/308,899, filed on Feb. 10, 2022.

(51) Int. Cl.
*G06F 8/41*   (2018.01)
*G06F 13/16*  (2006.01)

(52) U.S. Cl.
CPC .............. *G06F 8/457* (2013.01); *G06F 8/453* (2013.01); *G06F 13/1605* (2013.01)

(58) Field of Classification Search
CPC .................................................. G06F 13/1605
See application file for complete search history.

(56) References Cited

U.S. PATENT DOCUMENTS 8,321,618 B1 *  11/2012  Keil .................... G06F 13/1605
                                                    710/310
10,698,853 B1    6/2020  Grohoski et al.
(Continued)

FOREIGN PATENT DOCUMENTS

EP      1877927 B1    3/2011
WO   2010142987 A1   12/2010

OTHER PUBLICATIONS

Koeplinger et al., Spatial: A Language and Compiler for Application Accelerators, PLDI '18, Jun. 18-22, 2018, Association for Computng Machinery, 16 pages.

(Continued)

*Primary Examiner* — Michael J Metzger
(74) *Attorney, Agent, or Firm* — Flagship Patents; Bruce A. Young

(57) ABSTRACT

A coarse-grained reconfigurable (CGR) processor comprises a first network and a second network; a plurality of agents coupled to the first network; an array of CGR units coupled together by the second network; and a tile agent coupled between the first network and the second network. The tile agent comprises a plurality of links, a plurality of credit counters associated with respective agents of the plurality of agents, a plurality of credit-hog counters associated with respective links of the plurality of links, and an arbiter to manage access to the first network from the plurality of links based their associated credit-hog counters. Furthermore, a credit-hog counter of the plurality of credit-hog counters changes in response to processing a request for a transaction from its associated link.

20 Claims, 7 Drawing Sheets

(56) References Cited

U.S. PATENT DOCUMENTS

| | | | |
|---|---|---|---|
| 10,908,914 B2 | 2/2021 | Vorbach et al. | |
| 2005/0257012 A1* | 11/2005 | Hughes | G06F 13/1605 |
| | | | 711/158 |
| 2009/0300262 A1* | 12/2009 | Vorbach | G06F 15/7867 |
| | | | 711/E12.082 |
| 2010/0191911 A1 | 7/2010 | Heddes et al. | |
| 2010/0293304 A1* | 11/2010 | Alexandron | G06F 13/28 |
| | | | 710/25 |
| 2015/0227490 A1 | 8/2015 | Seo et al. | |
| 2016/0055120 A1 | 2/2016 | Vorbach et al. | |
| 2016/0188469 A1 | 6/2016 | Nagarajan et al. | |
| 2018/0089132 A1 | 3/2018 | Atta et al. | |
| 2022/0171716 A1* | 6/2022 | Benisty | G06F 9/546 |
| 2023/0070690 A1 | 3/2023 | Mugu et al. | |
| 2023/0244748 A1 | 8/2023 | Natarja et al. | |
| 2023/0251839 A1 | 8/2023 | Shah et al. | |
| 2023/0251993 A1 | 8/2023 | Shah et al. | |
| 2024/0020261 A1 | 1/2024 | Jordan et al. | |

OTHER PUBLICATIONS

M. Emani et al., Accelerating Scientific Applications With Sambanova Reconfigurable Dataflow Architecture, in Computing in Science & Engineering, vol. 23, No. 2, pp. 114-119, Mar. 26, 2021, [doi: 10.1109/MCSE.2021.3057203].
PCT/US2023/012723/—International Search Report and Written Opinion, dated May 31, 2023, 13 pages.
Podobas et al, A Survey on Coarse-Grained Reconfigurable Architectures From a Performance Perspective, IEEEAccess, vol. 2020.3012084, Jul. 27, 2020, 25 pages.
Prabhakar et al., Plasticine: A Reconfigurable Architecture for Parallel Patterns, ISCA, Jun. 24-28, 2017, 14 pages.
U.S. Appl. No. 63/349,733, filed Jun. 7, 2022, Manish K. Shah.
CA 3125707—First Office Action, dated Jan. 21, 2022, 3 pages.
CA 3125707—Voluntary Amendments, dated Jan. 4, 2022, 8 pages.
EP 20702339.8—Response to Rules 161(1) and 162 Communication, filed Feb. 25, 2022, 10 pages.
EP 20702939.8—Rules 161(1) and 162 Communication, dated Aug. 18, 2021, 3 pages.
Ming et al., A Reconfigurable Soc for Block Ciphers with a Programmable Dataflow Structure, dated Apr. 18-20, 2011, Third International Conference on Communications and Mobile Computing, 4 pages.
PCT/US2020/012079—International Preliminary Report on Patentability, dated May 7, 2021, 14 pages.
PCT/US2020/012079—International Search Report and Written Opinion mailed Apr. 29, 2020, 18 pages.
PCT/US2020/012079—Second Article 34 Amendment {Response to Informal Communication by Telephone) dated Feb. 2, 2021, as filed on Apr. 2, 2021, 5 pages.
Prabhakar et al., SambaNova SN10 RDU: A 7nm Dataflow Architecture to Accelerate Software 2.0, dated Feb. 20-26, 2022, IEEE International Solid-State Circuits Conference, 3 pages.
TW 108148376—Notice of Allowance dated Oct. 23, 2020, 5 pages.
TW 108148376—Request for Exam and Voluntary Amendment filed Jun. 30, 2020, 17 pages.
TW 110101760—First Office Action dated Mar. 29, 2022, 12 pages.
TW110101760—Notice of Allowance, dated Sep. 21, 2022, 2 pages.
U.S. Appl. No. 16/239,252—Notice of Allowance dated Feb. 12, 2020, 10 pages.
U.S. Appl. No. 16/239,252—Notice of Allowance dated May 14, 2020, 15 pages.
U.S. Appl. No. 16/239,252—Office Action dated Aug. 7, 2019, 8 pages.
U.S. Appl. No. 16/239,252—Response to Final Office Action dated Jan. 8, 2020 filed Jan. 24, 2020, 14 pages.
U.S. Appl. No. 16/239,252—Response to Office Action dated Aug. 7, 2019, filed Sep. 26, 2019, 6 pages.
U.S. Appl. No. 16/239,252 Final Office Action, dated Jan. 8, 2020, 13 pages.
U.S. Appl. No. 16/862,445—Notice of Allowance, dated Sep. 17, 2021, 15 pages.
U.S. Appl. No. 16/862,445—Response to Office Action dated Mar. 18, 2021, filed Jun. 9, 2021, 12 pages.
U.S. Appl. No. 18/107,613—Non-Final Rejection dated May 13, 2024, 8 pages.
U.S. Appl. No. 18/107,690—Notice of Allowance, dated Mar. 6, 2024, 9 pages.
U.S. Appl. No. 18/199,361—Non-Final Rejection dated Dec. 21, 2023, 12 pages.
U.S. Appl. No. 18/199,361—Non-Final Rejection dated Jul. 3, 2024, 17 pages.
U.S. Appl. No. 18/383,718—Notice of Allowance, dated Jul. 15, 2024, 12 pages.

* cited by examiner

HEAD OF LINE BLOCKING MITIGATION IN A RECONFIGURABLE DATA PROCESSOR

CROSS-REFERENCE TO RELATED APPLICATIONS

This application claims the benefit of U.S. Provisional Patent Application No. 63/308,899, entitled "Head of Line Mitigation in a Reconfigurable Data Processor," filed on Feb. 10, 2022, and U.S. Provisional Patent Application No. 63/349,733, entitled "Head-Of-Line Blocking Mitigation In A Reconfigurable Data Processor," filed on Jun. 7, 2022. Both of the provisional applications are hereby incorporated by reference for all purposes.

RELATED APPLICATION(S) AND DOCUMENTS

This application is related to the following papers and commonly owned applications:
  Prabhakar et al., "Plasticine: A Reconfigurable Architecture for Parallel Patterns," ISCA '17, Jun. 24-28, 2017, Toronto, ON, Canada;
  Koeplinger et al., "Spatial: A Language And Compiler For Application Accelerators," Proceedings Of The 39th ACM SIGPLAN Conference On Programming Language Design And Embodiment (PLDI), Proceedings of the 43rd International Symposium on Computer Architecture, 2018;
  U.S. Nonprovisional patent application Ser. No. 16/239,252, filed Jan. 3, 2019, now U.S. Pat. No. 10,698,853, entitled "VIRTUALIZATION OF A RECONFIGURABLE DATA PROCESSOR;"
  U.S. Nonprovisional patent application Ser. No. 16/197,826, filed Nov. 21, 2018, now U.S. Pat. No. 10,831,507, entitled "CONFIGURATION LOAD OF A RECONFIGURABLE DATA PROCESSOR;"
  U.S. Nonprovisional patent application Ser. No. 16/407,675, filed May 9, 2019, now U.S. Pat. No. 11,386,038, entitled "CONTROL FLOW BARRIER AND RECONFIGURABLE DATA PROCESSOR;"
  U.S. Nonprovisional patent application Ser. No. 16/890,841, filed Jun. 2, 2020, entitled "ANTI-CONGESTION FLOW CONTROL FOR RECONFIGURABLE PROCESSORS;"
  U.S. Nonprovisional patent application Ser. No. 16/922,975, filed Jul. 7, 2020, entitled "RUNTIME VIRTUALIZATION OF RECONFIGURABLE DATA FLOW RESOURCES;"
  U.S. Provisional Patent Application No. 63/236,218, filed Aug. 23, 2021, entitled "SWITCH FOR A RECONFIGURABLE DATAFLOW PROCESSOR."
  All of the related application(s) and documents listed above are hereby incorporated by reference herein for all purposes.

TECHNICAL FIELD

The present subject matter relates to head of line mitigation in a data processor, which can be applied to meter access by a plurality of links in a data flow graph to a shared physical interface.

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

Coarse grain reconfigurable architectures (CGRAs) exhibit far superior performance over conventional architectures, such as field programmable gate arrays (FPGAs) as they provide the capability to execute applications as nested dataflow pipelines. Such systems can use external data processing resources not implemented using the configurable array and interconnect, including memory and a processor executing a runtime program, as sources or sinks of data used in the graph. These data processing resources can be on different integrated circuits than the array of configurable units and the configurable interconnect, and can require standardized interfaces or interfaces not compatible with the configurable interconnect. The data addressing system inside the array of configurable units can be a virtual addressing system, and can require translation to the physical address space of the external data processing resources in order to configure these links in the graph.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

Figure 1:
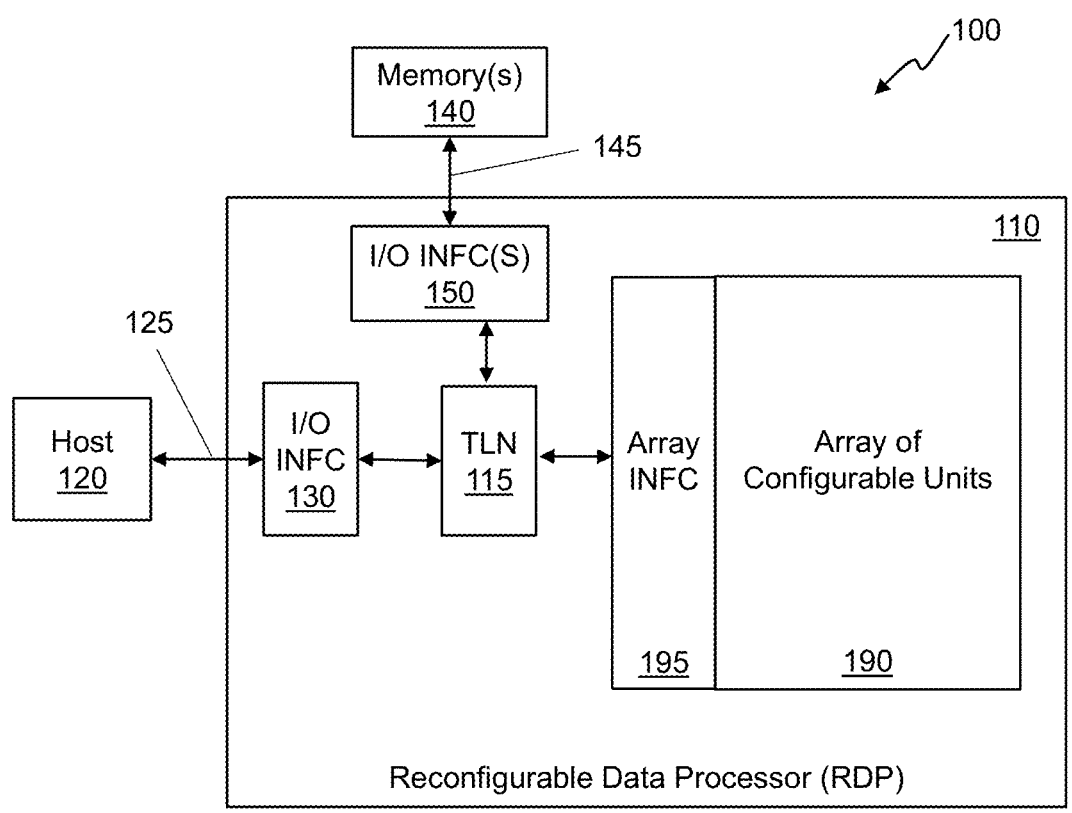
FIG. 1 is a system diagram illustrating a system including a host, a memory, and a reconfigurable data processor.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Some descriptive terms and phrases are presented in the following paragraphs for clarity.

In a data flow system, an array of configurable units is disposed in a configurable interconnect (array level network), and the configuration file defines a data flow graph including functions in the configurable units and links between the functions in the configurable interconnect. In this manner the configurable units act as sources or sinks of data used by other configurable units providing functional nodes of the graph.

As stated earlier, such systems can use external data processing resources not implemented using the configurable array and interconnect, including memory and a processor executing a runtime program, as sources or sinks of data used in the graph. These data processing resources can be on different integrated circuits than the array of configurable units and the configurable interconnect, and can require standardized interfaces or interfaces not compatible with the configurable interconnect. The data addressing system inside the array of configurable units can be a virtual addressing system, and can require translation to the physical address space of the external data processing resources in order to configure these links in the graph.

So, a technology is provided that includes communication resources which can be configured to set up links between the configurable interconnect and these external data processing resources in a manner that enables their use as sources or sinks of data in the data flow graph.

An interface between the configurable interconnect of the array (array level network) and the communication resources for connection to external data processing resources (top level network TLN) is described. The interface (AGCU) is configurable to establish a plurality of links (multiple VAGs) between external resources (memory or a processor) and the array to set up a complex graph, where each link may operate independently of the other links but share a single physical port (or a small number of ports) to the communication resources. However, there can be factors that are not knowable at compile time, such as variations in the actual system architecture in which the graph is to be loaded.

The links (VAGs) may be configurable to access the data processing resources (memory or a processor) via the communication resources (TLN including multiple TLN destinations), which in turn are accessed via a common physical port of the interface (AGCU). In other words, in order to access an external data processing resource (memory or processor), each link (VAG) may have to first access a communication resource (TLN destination) via the common physical port of the interface (AGCU). Furthermore, each communication resource (TLN destination) may allow only a few accesses simultaneously (as indicated by credits) for the common physical port of the interface (AGCU) link. Therefore, an arbiter may be implemented to select a single link to access a communication resource via the common physical port in a single arbitration cycle. The arbiter may carry out as many arbitration cycles as the links, selecting one link each arbitration cycle. However, in existing systems, by the time a link (VAG) is selected it may not be known if the common physical port of the interface (AGCU) has any credits available for the communication resource it is trying to access. In such a scenario, the interface (AGCU) can block the access request from going out on the TLN resulting in no other link's access request getting to the TLN. This problem is known as head-of-line blocking. Such a link may block another link which may have credits for its corresponding communication resource. The problem of the head-of-line blocking can be predicted in some settings and mitigated when compiling the configuration file for the data flow graph.

Embodiments in the present disclosure provide systems and methods by which a controller can arbitrate the links (each of which can include virtual address generators or VAGs as described herein) based on a priority scheme to apply a variable bandwidth to access the TLN. The priority scheme may assign a higher or lower priority to a VAG to access the TLN based on the frequency of TLN destination addresses being accessed by it. The throughput of the link including the VAG to access the TLN or one or more TLN destination addresses may be dependent on, and in some cases proportional to, its priority. In other words, a link using a VAG with a higher priority may have a higher throughput to access the TLN and eventually the external memory and a link using a VAG with a lower priority may have a lower throughput, and can be blocked for substantial periods of time, to access the TLN and eventually the external memory.

Embodiments in the present disclosure provide systems and methods by which a controller can arbitrate the links (each of which can include virtual address generators or VAGs as described herein) based on a priority scheme to apply a variable bandwidth to access the TLN. The priority scheme may assign a higher or lower priority to a VAG to access the TLN based on the frequency of TLN destination addresses being accessed by it. The throughput of the link including the VAG to access the TLN or one or more TLN destination addresses may be dependent on, and in some cases proportional to, its priority. In other words, a link using a VAG with a higher priority may have a higher throughput to access the TLN and eventually the external memory and a link using a VAG with a lower priority may have a lower throughput, and can be blocked for substantial periods of time, to access the TLN and eventually the external memory.

One technology for arbitrating access to the TLN can include a special purpose counter, referred to as a credit-hog counter for each VAG which is initialized to zero. The credit-hog counter for each VAG may be incremented under two conditions: the first condition is if the VAG requests an access to the same TLN destination as the previous one, and the second condition is if the VAG's available credits for the particular TLN destination is lower than a predefined threshold. The credit-hog counter may be incremented by one if the first or the second or both conditions are true. If either condition is not met then the credit-hog counter is decremented. In other words, if a VAG requests an access to a different TLN destination than the previous one, then the credit-hog counter may be decremented by one. Furthermore, if the value of the credit-hog counter is greater than zero, then the VAG may be identified as a credit-hog VAG and may be assigned a priority lower than a non-credit hog VAG.

In some embodiments, there may be special registers implemented to mark a VAG as "ready" if a destination address related to that has been calculated and mark a VAG as "not ready" if the destination address related to that is not yet calculated. Furthermore, only those VAGs which are marked ready may be allowed to participate in the arbitration for accessing the external memory.

Example details about the configurable units (array), the configurable interconnect (array level network or ALN), the external data processing resources, the communication resources for connection to the external data processing resources (top level network), and the interconnections of all of the above will now be explained.

As will be shown, in one example, the TLN can include a mesh of "switches" which connect or couple to multiple TLN agents (hereinafter "agents"), which are considered as destinations. In this example, the communication over TLN occurs via a dimension order routing. The TLN can further include multiple independent networks namely, a data network, a response network, a request network, and a credit network, all similar to each other in configurations and connections to the agents and the switches and all operating in parallel. All the four networks are configured to operate in parallel. In one embodiment, the request network is used for sending and receiving read and write requests over the TLN. The data network is used for sending write data and receiving read data over the TLN. The response network is used for sending and receiving responses corresponding to read or write requests over the TLN. The credit network is used for sending and receiving credits or credit packets for managing the traffic over the TLN. As will be explained later, there may be dedicated links between agents and switches for each network.

All the four networks (request, data, response, and credit) may use packets also referred to as "payload packets" for sending and receiving information over and may follow similar protocols. In various embodiments, the payload packets may have the same or different sizes and formats for the payload packets.

As will be shown, more particularly, the TLN may comprise TLN switches and TLN agents. Similarly, the array level network also can have agents (AGCUs) which are known as tile agents. Simply put, the TLN switches interconnect the TLN agents and the tile agents, to bring about a communication for a data flow link between the configurable units to an external memory and a host. AGCUs have physical interfaces to the TLN, which include TLN agents. Furthermore, a communication typically occurs between a driver TLN agent (driver) and a receiver TLN agent (receiver).

The transactions over TLN can occur based on a credit-flow system. In this example, there are two types of credits used to manage traffic on the TLN. A first type are the hop credits, which are used to manage the flow of transactions between adjacent points on the network. Every TLN agent typically has input queues to buffer incoming transactions. All TLN switches and agents utilize these hop credits. Hop credits are assigned to drivers based on the sizes of their internal queues. A driver cannot initiate a transaction (i.e., assert the valid signal) unless it has credits available.

A second type of credits are referred to as end to end (E2E) credits. In order to prevent persistent backpressure on the TLN, communication between agents on the TLN is controlled by E2E credits. In other words, an E2E credit serves as a contract between a source and a destination by which a source can only send a packet to a destination if the destination has credits available. The number of available credits is determined by the size of input queues in any destination. A TLN source checks for available credits at its final destination before initiating a transaction. If there are no available credits, then the transaction cannot be placed on the network. Agents generally perform both a hop credit check to the connected switch and an E2E credit check to the final destination. Typically, a transaction takes place if a credit is available for both credit types.

As explained earlier in, the disclosed technology can reduce the head-of-line blocking problem caused due to unknown factors while the graph is being loaded. This can be implemented using a credit-hog logic. A TLN credit network as disclosed includes a credit hog logic to reduce likelihood of some routes in the TLN being blocked by others.

The TLN switches implement an arbitration policy that is based on a scheme that attempts to fairly distribute bandwidth across all potential network sources. In each switch, a set of counters (one counter per source) is maintained. A "source" in this context means any agent which could have placed packets over the TLN. When a packet is selected by switch through arbitration, the source ID is decoded and a counter for that source is incremented. An increasing count indicates that a particular source is using a portion of bandwidth through the switch, and in order to maintain fairness, should be given lower priority than sources which have not consumed as much switch bandwidth. As such, output port arbitration is performed by looking at the source id of the packet at the head of each input FIFO, extracting their corresponding counter values, and comparing those values. The one with the minimum value wins arbitration. Those sources which win arbitration will have their counter values incremented.

FIG. 1 is a system diagram illustrating an example system including a host 120, a memory 140, and a reconfigurable data processor 110. As shown in the example of FIG. 1, the RDP 110 includes an array 190 of configurable units and an interface 195 to a top level network 115 which may be called an address generation and coalescing unit (AGCU) herein. The interface 195 can include a configuration load controller and a configuration unload controller. The configuration load controller and the configuration unload controller may be implemented using separate logic and data path resources or may be implemented using shared logic and data path resources as suits a particular embodiment.

The reconfigurable data processor 110 includes an external I/O interface 130 connected to the host 120, and external I/O interface 150 connected to the memory 140. The I/O interfaces 130, 150 connect via the top level network (TLN) 115 through the interface 195 to the array 190 of configurable units.

To configure configurable units in the array 190 of configurable units with a configuration file, the host 120 can send the configuration file to the memory 140 via the interface 130, the top level network 115, and the interface 150 in the reconfigurable data processor 110. The configuration file can be loaded in many ways, as suits a particular architecture, including in data paths outside the reconfigurable data processor 110. The configuration file can be retrieved from the memory 140 via the memory interface 150, the top level network 115 and the interface 195. Chunks of the configuration file can then be sent in a distribution sequence to configurable units in the array 190 of configurable units in the reconfigurable data processor 110.

An external clock generator 170 or other clock signal sources can provide a clock signal 175 or clock signals to elements in the reconfigurable data processor 110, including the array 190 of configurable units, and the bus system 115, and the external data I/O interfaces.

Examples of the array 190 and an array level network are described in the attached U.S. Pat. No. 10,698,853 B1, which is incorporated by reference into this specification.

Figure 2:
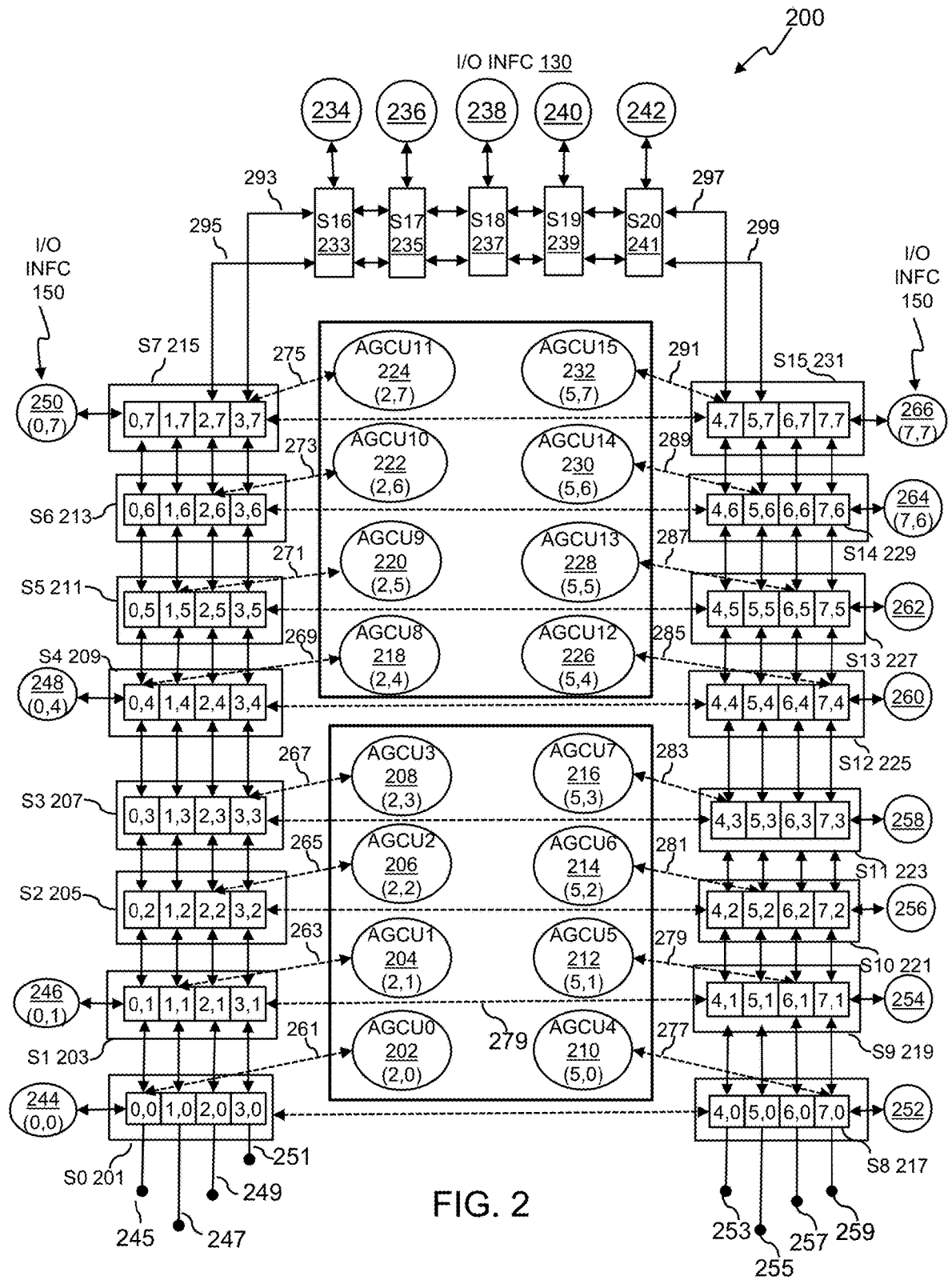
FIG. 2 illustrates an example block diagram of a TLN, according to an embodiment of the present disclosure.

FIG. 2 illustrates an example block diagram 200 of a TLN and its agents, which can be an example of the TLN 115 connected to embodiments of the array interface 195, I/O INFC 130, I/O INFC 150 shown in FIG. 1.

As shown, the TLN 200 can include TLN switches S0 201-S15 231 connected to agents 244 to 266 and switches S16 to S20 connected to agents 234 to 242. The agents 244-252 are examples of the I/O INFC 150 which further connect to the memory 140 shown in FIG. 1. The agents 234-242 are examples of the I/O INFC 130 (also referred to as a host interface 130) which further connects to the host 120 shown in FIG. 1. It should be noted that in one embodiment, the memory 140 can include multiple memory units and the host 120 can include multiple host units. In other embodiments, the agents can be part of the I/O INFCs 130 or 150 or both. In one example, the memory 140 can include double-data-rate (DDR) memory or high-bandwidth memory (HBM) or a combination of both. The agents include circuits for translating the TLN packets to the format used by the DDR or HBM interfaces, called Dshim or Hshim herein. In one example, the host interface 130 can be PCIe and the agents 234 to 242 can be PCIe agents. The PCIe agents 234 to 242 can include one or more shims for connecting to the PCIe host and may be referred to as Pshims.

Additionally, the Dshims may further be coupled to one or more DDR controllers which may be further coupled to the one or more DDR memory units. Similarly, Pshims may be coupled to a PCIe controller which may be further coupled to the PCIe. The TLN may send the data and addresses for read and write requests to the external memory via the shims.

Although not explicitly shown in FIG. 2, it may be understood that the AGCU0 202-AGCU15 232 connect to the array of configurable units 190 included in different tiles. When considered as a whole, a TLN switches S0 201-S20 241 can receive a packet from an AGCU, from another TLN switch, or both, and send a packet to the AGCU, another switch, or both. This is shown by the bi-directional arrows. As explained earlier, the AGCU0 202-AGCU15 232 are also the agents on the TLN 200 and are operably coupled to the array 190 to provide an interface via which the configuration file defining a graph can be loaded to or unloaded from the array 190. Although, the AGCU0 202-AGCU15 232 are shown to be arranged inside the TLN 200, those may be separately implemented as shown in FIG. 2 or in any other fashion including being integrated with the TLN 200, as required by the design considerations. Additionally, all the interconnections shown may be bidirectional as shown in FIG. 2.

In this example, each of the switches from S0 201 to S15 231 has eleven ports, (four ports in the north direction, four ports in the south direction, one port in the east direction, one port in the west direction, and one local port to connect to an AGCU. The east and the west ports can be for connecting to either a neighboring switch or to an agent. The north and south ports are for connecting to neighboring switches. For example, the switch S1 203 has four south ports (to connect to the switch S0 201), four north ports (to connect to the switch S2 205), one west port to connect to the agent 246, one east port to connect to the neighboring switch S9 219 (as shown by the arrow 279), and one local port to connect to AGCU1 204 (as shown by the arrow 263).

In one embodiment, each switch can be further arranged to include four nodes (internal switches) with unique IDs. For example, the switch S1 203 includes four nodes shown by IDs (0,1), (1,1), (2,1), and (3,1). The IDs of the nodes correspond to the (x,y) coordinates of the plane in which the nodes are arranged. For example, in the switch S0 201, the nodes are shown by (0,0), (1,0), (2,0), and (3,0) where "y" coordinate represents the row number "0" and the "x" coordinate represents the column number. AGCU0 202-AGVU15 232 are referenced using the row number of the switch to which they are connected, but using a specific column number (e.g., 2 or 5 in FIG. 2).

Each node can be configured as a separate switch as well. In such a case, each switch can include three nodes having four ports (east, west, north, south for connecting to neighboring nodes or agents or both) and one node having five ports (east, west, north, south for connecting to neighboring nodes or agents or both) and a local port for connecting to an AGCU. For example, in case of the switch S1 203, the node (0,1) has four ports namely a west port for connecting to the node 246, a west port for connecting to the node (1,1), a north node for connecting to the node (0,2), and a south port for connecting to the node (0,0). The nodes (2,1) and (3,1) also have four ports each. Additionally, the node (1,1) has four ports (first for connecting to (0,1), second for connecting to (2,1), third for connecting to (1,0), fourth for connecting to (1,2), and also a fifth port to connect to the AGCU1 204. The switches S16 233 to S20 241 may also have internal switches (not shown) similar to the other switches. The TLN traffic from switches S16 233-S20 241 can be appropriately steered to their corresponding nodes via the connections 293 to 299.

As mentioned earlier, the TLN includes four independent sub-networks (request, data, response, and credit) operating in parallel. Each of the nodes can be used for one of the networks. For example, if switch S1 203 is considered, then the node (0,1) can be used for data network, node (1,1) can be used for request network, node (2,1) can be used for response network, and node (3,1) can be used for the credit network. Furthermore, all the nodes from a particular column may be connected on a particular sub-network.

The agents are arranged logically in rows and columns, and can be arranged physically in rows and columns as well, which can facilitate the use of more uniform physical links between the agents. In one embodiment, the agents may also have node IDs which may be referenced by an (x,y) coordinate system. As shown, the I/O INFC 150 agent 244 can have a node ID (0,0). Similarly, other agents 246 (0,1), 248 (0,4), 250 (0,7), 264 (7,6) 266 (7,7) have the IDs shown in the parentheses. Although not shown the agents 252, 254, 256, 258, 260, 262, also have IDs corresponding to their (x,y) coordinates. In the FIG. 2, the AGCU0 202 to AGCU3 2-8 and AGCU8 218 to AGCU11 224 are also shown to have IDs (2,0,) to (2,7) respectively and AGCU4 210 to AGCU 7 216 and AGCU12 226 to AGCU15 232 are shown to have IDs (5,0) to (5,7) respectively. The node IDs are used to route packets to a proper destination. For a dual-die configuration, a die_id bit can also be added to the (x,y) coordinates to identify which of the two die an agent belongs to.

Furthermore, in the example shown, each agent is directly connected or coupled to one of the nodes. For example, the agent 244 is shown to be connected to the node (0,0) of the switch S0 201. Similar configuration is also shown for other agents. In other embodiments, the node may be connected to more than one nodes. This connection may decide the routing of packets for the various switches. In this example, the nodes (0,0), (0,1), (0,4), and (0,7) may provide the final routing link to the agents 244, 246, 248, and 250 respectively for other packets coming from nodes that are not directly connected to these agents.

As explained earlier, AGCU0 202-AGCU 15 232 are also configured to directly communicate with one or more nodes in specific columns and may send and receive packets to those particular switches. For example, the AGCU0 202 is configured to communicate directly with the node (0,0) as indicated by a link 261 and AGCU1 204 is configured to communicate with the node (1,1) as indicated by a link 263. Similar connections are shown for other AGCUs as well as for their corresponding switches. In other embodiments, the AGCUs may be configured to work with more than one switch. In yet other embodiments, the AGCUs may communicate with a variable number of switches depending on the need of the design.

Figure 3:
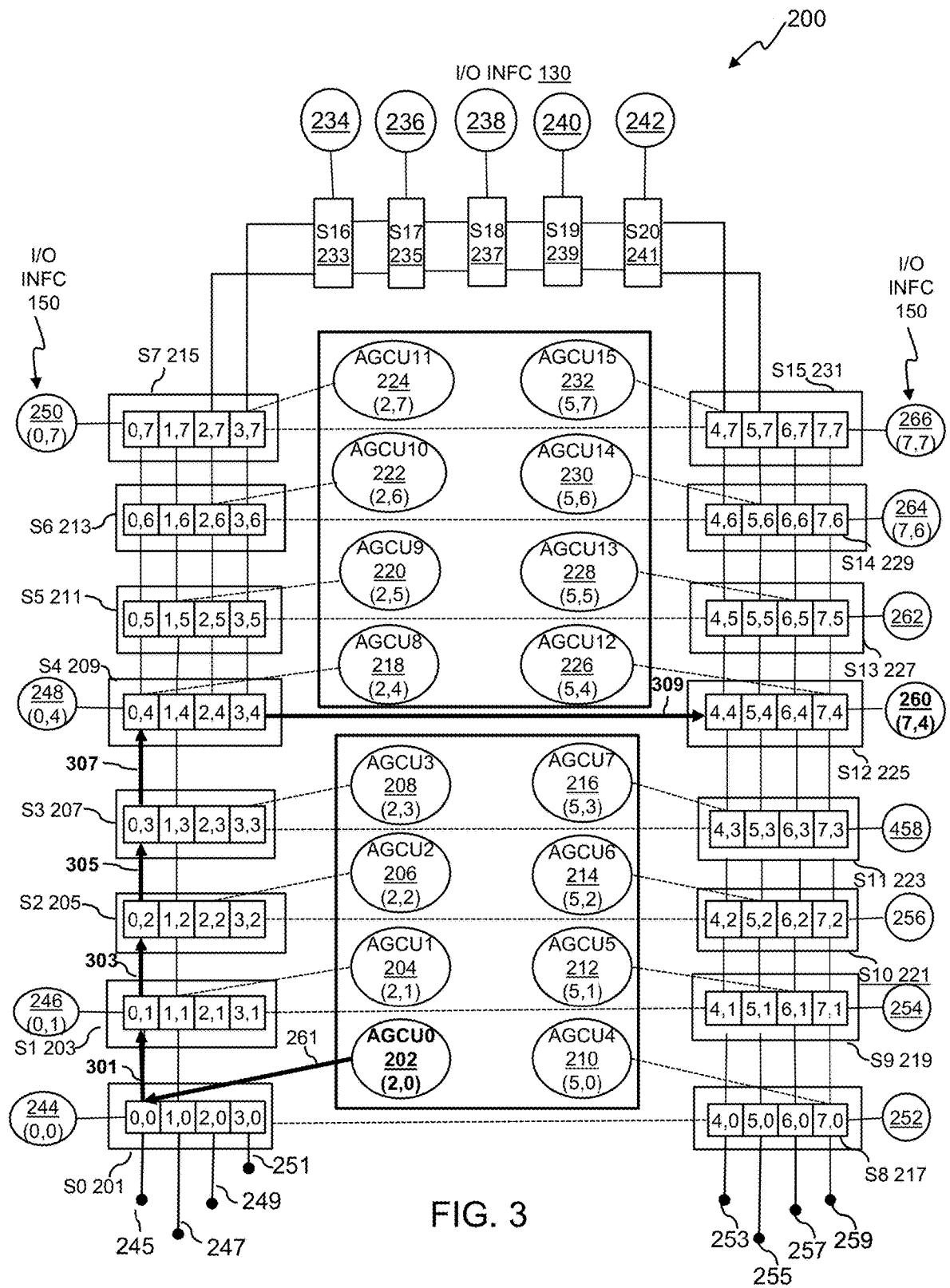
FIG. 3 illustrates an example block diagram of the TLN with further example details of node IDs and packet routing protocols, according to an embodiment of the present disclosure.

FIG. 3 illustrates the TLN block diagram 200 with further example details of node IDs and an example packet routing protocol. In the TLN 200 information packets are exchanged between any two agents. The agents include I/O INFC agents 130, 150 and AGCU0 202-AGCU15 232. The switches provide paths for the information packets to go from one node to another. In doing so, the packets follow a protocol that is vertical-first-horizontal-last. Other embodiments may follow a different protocol for routing, such as horizontal-first-vertical-last. This means that, in general, a packet is routed (moved) along a column until it is at the same "y" coordinate as its destination and then routed horizontally (along the "x" axis) to its final destination. This can be more clearly understood by the bolded arrows 261, 301, 303, 305, 307, and 309 shown in FIG. 3. For example, it may be assumed that a packet is being sent from the AGCU0 202 (2,0) to the agent 260 (7,4). In this case, the source ID is equal to (2,0) and the destination ID is equal to (7,4). Since AGCU0 202 is connected to the node (0,0) of the switch S0 201, the packet will be routed vertically first from the switch S0 201 to the switch S4 209 as shown by the vertical bolded arrows 301, 303, 305, and 307. More specifically, the packet will be routed upward until its "y" coordinate is equal to the destination ID's "y" coordinate. Then the packet will move horizontally as shown by the horizontal bolded arrow 309 to the switch S12 225 and its node (4,4). The packet will further be routed along the nodes from (4,4) to (5,4) to (6,4) to (7,4) and then to its final destination node 260 (7,4). Note that the internal construction of the switch may not require separate movement of the data between nodes within the switch, but the nodes may be treated as logical entities so that the switch may be a single switch with 1 port to the east, 1 port to the west, 4 ports to the north, 4 ports to the south, and one port for an AGCU.

Since the TLN has four parallel networks data, credit, response, and requests, it may be appreciated that the sources and destinations on TLN are configured to send or receive (or both) data packets or credit packets or response packets or request packets or any combination of these packets to each other. Columns may be dedicated to specific type of packets in each parallel network. Due to their packet based protocols, the various TLN networks also may be referred to as "packet switched networks". For example, the TLN credit network, the TLN data network, the TLN response network, and the TLN response network may be referred to as packet switched credit network, packet switched data network, packet switched request network, and packet switched response network respectively. In other embodiments, any TLN network may have physical connections to specific agents and credits/data/requests/responses may be sent as physical signals instead of packets.

Thus, in the above example the packet may be a data packet or a request packet or a response packet or a credit packet. Depending on the type of packet, it may be decided which network is to be used for transmitting the packet. For example, it may be assumed that the TLN 200 shown in FIG. 3 is a credit network, then all the other agents (other agents and AGCUs) may use their corresponding columns as mentioned for sending and receiving data packets.

Since the TLN 200 shown in FIG. 3 is a credit network, the packet sent by the AGCU0 202 to the node 260 (7,4) is a credit packet. If the AGCU0 202 wants to send a data packet, a request packet, or a response packet to the agent 260 (7,4), then it may use the column 245 of the TLN data network, TLN request network, or TLN response network (which are similar and parallel to the credit network) respectively.

As explained earlier, the communication over TLN network takes place based on a credit protocol or availability of credits. In one embodiment, various TLN agents and switches have first-in-first-out registers (FIFOs) to hold the packets in a queue. In simplest terms, a credit means a space to hold a packet. When a sender sends a packet to a receiver, there needs to be space in the receiver FIFO to hold the packet otherwise the packet may be lost. To avoid any loss of packets, a credit protocol is implemented on the TLN. The credit protocol means that the sender has to make sure that the receiver has space for the packet that is being sent. Furthermore, the receiver also sends an acknowledge signal to the sender. In general, there can be two types of credits to manage flow control on TLN. A first type of credit is a "hop" credit, which can occur between any two adjacent points such as any two nodes or between a node and an agent. A second type of credit is an "end-to-end" credit, which can occur between any two end-to-end points, which can be any two TLN agents. For each credit protocol there is a sender and a receiver. The sender and the receiver participating in a hop credit protocol may be referred to as a "hop source" and a "hop destination" respectively. The sender and the receiver participating in an E2E credit protocol may be referred to as an "E2E source" and an "E2E destination" respectively. In a hop credit protocol, a first type of credit is known as a per-hop credit, which is implemented for hops between any two adjacent points on the TLN.

For example, referring back to FIG. 2, a per-hop credit protocol can be implemented between the agent 244 and the node (0,0), node (0,0) and AGCU0 202, node (0,0) and node (1,0), node (1,0) and node (2,0), node (2,0) and node (3,0), and so on and so forth. Similarly, a per-hop credit protocol may be implemented in the nodes of adjacent switches. For example, if a packet is being sent from the node (0,0) (sender) to the node (1,0) (receiver), then the FIFO in the node (1,0) has to have space to hold the packet. The node (0,0) (sender) has to make sure that the node (1,0) (receiver) has space to hold the packet. In other words, if for the above mentioned hop protocol, the node (0,0) sender may be considered as a source and the node (1,0) receiver may be considered as a destination, then the source has to make sure that the destination has a space for the packet. Any available space may be represented by a "credit/s". For example, if a receiver has a four-entry deep FIFO and if it is all empty then that means the source can have four credits for that destination.

Figure 3A:
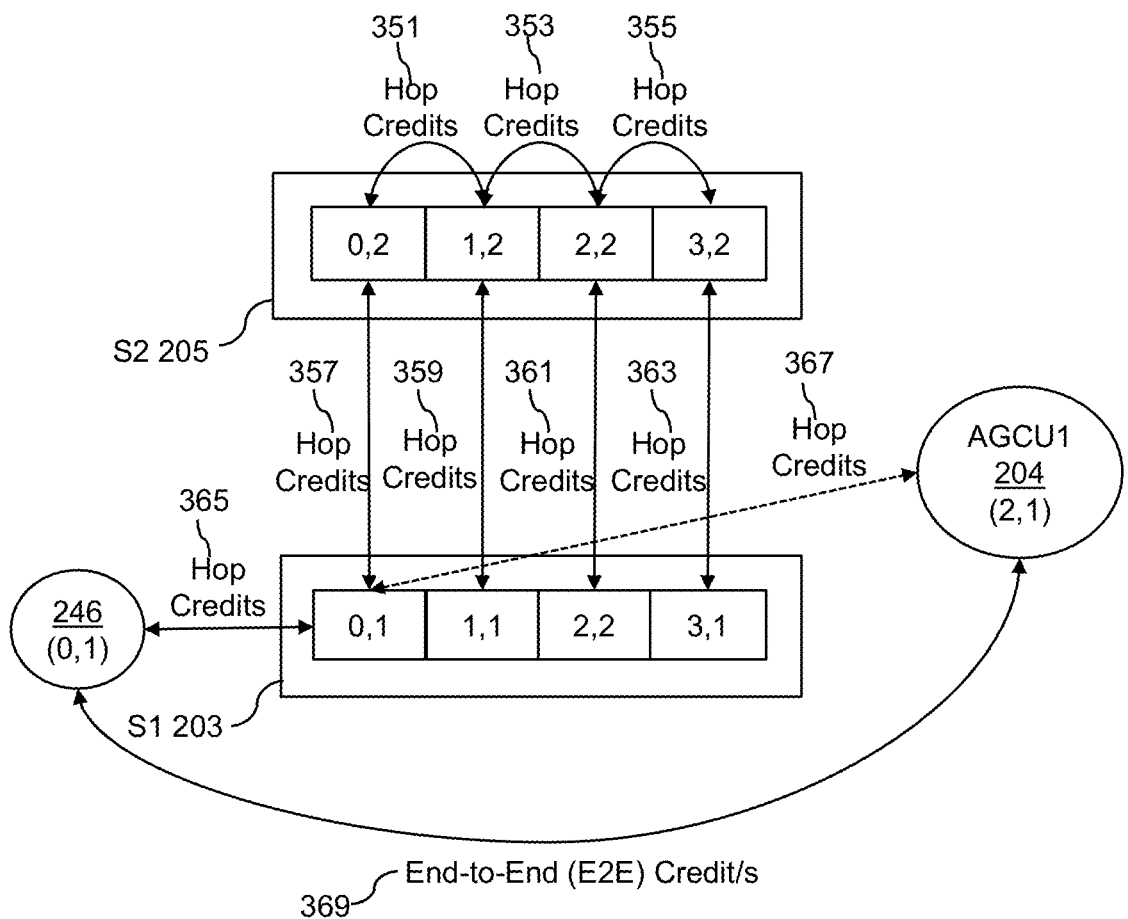
FIG. 3A illustrates an example block diagram of the TLN with further example details of credits, according to an embodiment of the present disclosure.

An example of the hop credits and E2E credits is shown in FIG. 3A which illustrates a portion of the TLN 200 including the agent 246 (0,1), AGCU1 204, (2,1) switches S1 203 and S2 205. As shown, a credit protocol between the agent 246 (0,1) and the AGCU1 204 can be treated as an E2E credit protocol which is based on E2E credits shown by 369 exchanged between the node 246 (0,1) (one TLN agent) and the AGCU1 204 (another TLN agent). As shown further, the credit protocols between the nodes of S2 205 are also treated as hop credit protocols and are based on hop credits 351, 353, 355. Similar hop credits are exchanged between the nodes of S1 203. Similarly, a credit protocol between the agent AGCU1 246 (0,1) and the node (0,1) of the switch S1

203 is based on hop credits 365, and a credit protocol between AGCU1 204 (2,1) and the node (0,1) is based on the hop credits 367. Similarly, a credit protocol between the nodes of S1 203 ((0,1), (1,1), (2,1), (3,1)) and the nodes of S2 205 ((0,2), (1,2), (2,2), (3,2)) is based on the hop credits 357, 359, 361, and 363.

In order to manage the hop credits and the E2E credits, all TLN agents (I/O INFC 130, 150, and AGCUs) and switches may implement one or more credit counters. A credit counter as such may increment or decrement to indicate the available credits (space available in its hop destination or E2E destination). More particularly, each TLN agent (e.g., each of the AGCUs of AGCU0 202 to AGCU15 232, I/O INFC agents 130, or I/O INFC agents 130) can include a counter to keep track of E2E credits, whereas each of the switches S0 201 to S15 231 can include a credit counter to keep track of hop credits for each node. For example, the switch S0 201, can include one credit counter to keep track of hop credits for each of the nodes (0,0), (1,0), (2,0), and (3,0). In some other examples, each node may include its own credit counter/s for keeping track of its own credits. The TLN 200 may include a logic and control block (not shown) to implement the above-mentioned traffic protocols and to manage the traffic. The logic and control block may decide which columns and switches to use depending on the source and destination of the packets. The logic and control block may be configured to distribute traffic as evenly as possible across all columns and switches.

In one embodiment, each TLN agent may have a TLN interface to communicate over the TLN. A TLN transaction may typically include four parts, namely a valid signal, a header, a packet, and a credit signal, which may be sent over a plurality cycles generated by timing and clock generation units (not shown). In one embodiment, to initiate a transaction, the sender (driver) may assert a valid signal and drive a header on a link connected to a receiver. The header may include a source node ID and a destination node ID. In one embodiment, source node ID and the destination node ID may be the two endpoints of a transaction. In a subsequent clock cycle, the driver sends a packet. The transaction may be included in an internal queue of the receiver. The receiver sends a credit signal back to the driver when it dequeues the transaction from its internal queues.

The TLN switches implement an arbitration policy that is based on a scheme that attempts to fairly distribute bandwidth across all potential network sources. In each switch, a set of counters (one counter per source) is maintained. A "source" in this context means any agent which could have placed packets over the TLN.) When a packet is selected by arbitration, the source ID is decoded and a counter for that source is incremented. An increasing count indicates that a particular source is using a portion of bandwidth through the switch, and in order to maintain fairness, should be given lower priority than sources which have not consumed as much switch bandwidth. As such, output port arbitration is performed by looking at the source id of the packet at the head of each input FIFO, extracting their corresponding counter values, and comparing those values. The one with the minimum value wins arbitration. Those sources which win arbitration will have their counter values incremented. In one embodiment, the counter can be fixed in size (currently 8 bits), and when any counter overflows, all counters may be reset to zero in order to create a fair arbitration scheme. In other embodiments, the counter can have a variable size. In yet other embodiments, counters in various TLN switches can have different sizes. It would not be fair to simply let a counter roll over to zero, as this would make it the highest priority source. Instead, when any counter overflows, all counters will be reset to zero. This assures that old history does not build up in the mechanism, which is intended to smooth out short-term imbalances. The most critical timing path is the arbitration path, as the bandwidth counts must be selected, a comparison based selection performed, and the result sent to a number of destinations including the bandwidth counter updates and the header FIFO read enables.

As will be explained in more details now with respect to FIG. 4, each AGCU includes two address generators (AGs) and one coalescing unit (CU). Furthermore, at least one AGCU in each tile serves as a master AGCU and serves an interface to the host 120 shown in FIG. 1. The master AGCU is responsible for loading and unloading all components on the tile. The CU in the master AGCU includes configuration and status registers (CSRs).

Each CU further includes a TLN output interface which may also be coupled to the various TLN networks (credit/data/response/request) for sending and receiving corresponding packets. For example, the CU's TLN interface may be coupled to the request network for sending read and write request packets over TLN, to the data network for sending read data and/or write data packets, to the response network for sending response packets, and to the response network for sending responses corresponding to CSR write requests received. Similarly, each CU may include a TLN input interface which is coupled to the different portions of the main TLN network. For example, the CU's TLN interface may be coupled to the request network for receiving CSR read/write requests, to the data network for sending CSR read data and receiving CSR write data, and the response network for receiving responses corresponding to write requests generated by the CU.

Figure 4:
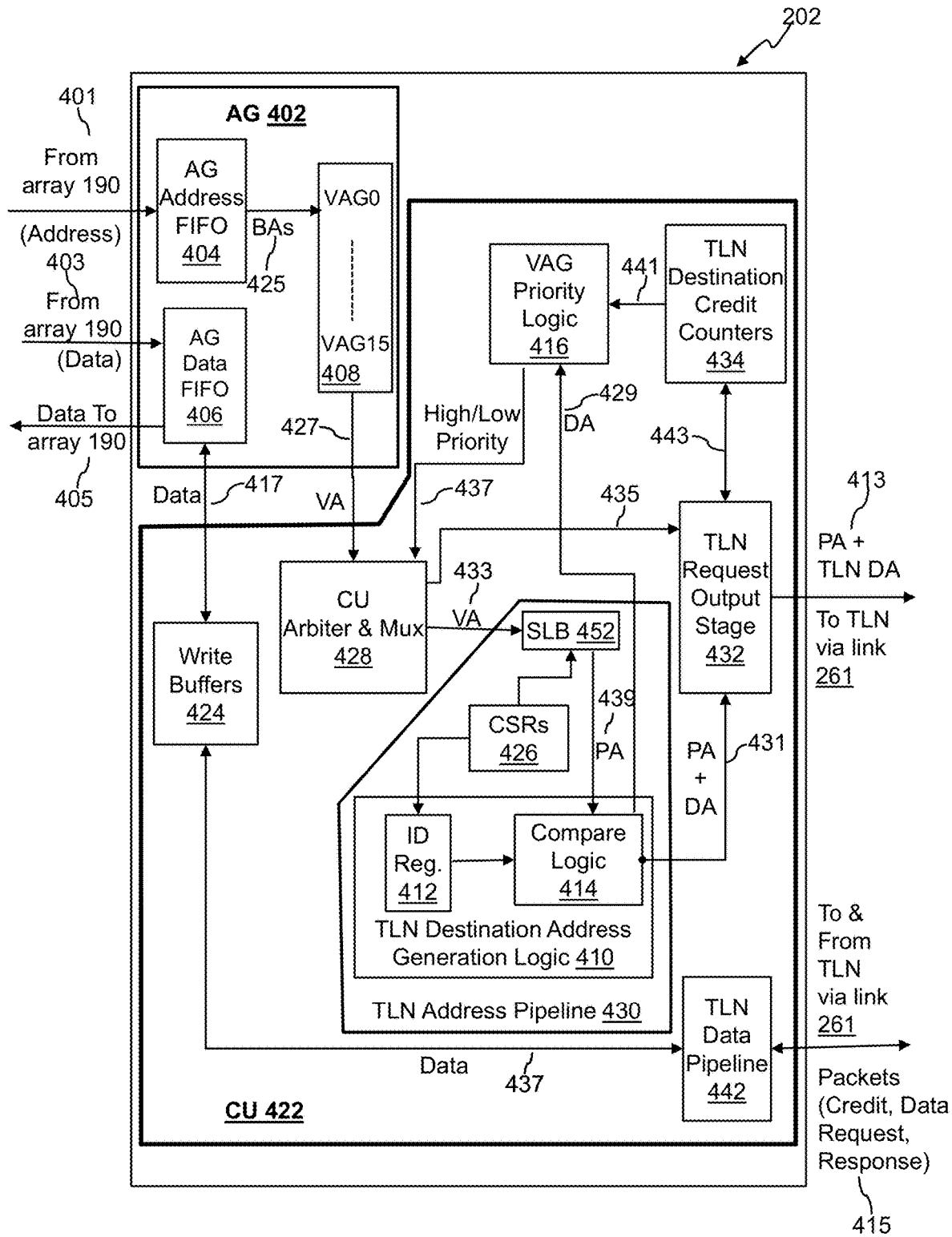
FIG. 4 illustrates an example block diagram of an address generation and coalescing unit (AGCU), included in the TLN of FIG. 2, according to an embodiment of the present disclosure.

FIG. 4 is a block diagram illustrating an example of address generation and coalescing unit (AGCU0) 202 included in the FIG. 2. Other AGCUs, may also have similar elements as shown in FIG. 4. As shown the AGCU0 202 includes an address generation unit AG 402 and a coalescing unit CU 422. As shown in the related U.S. Nonprovisional patent application Ser. No. 16/239,252, filed Jan. 3, 2019, entitled "VIRTUALIZATION OF A RECONFIGURABLE DATA PROCESSOR," which is incorporated herein by reference, the address generation unit AG 402 may further include two separate address generation units AG0 and AG1 (not shown).

The AG 402 may further include an AG address FIFO 404, an AG data FIFO 406, and sixteen virtual address generators (VAG0 to VAG15) 408. The AG address FIFO 404 and the AG data FIFO 406 each may include two separate FIFOs for AG0 and AG1. In the example shown, the coalescing unit (CU) 422 further includes write buffers 424, a CU arbiter & mux 428, a TLN address pipeline 430, a VAG priority logic unit 416, TLN destination credit counters 434, a TLN request output stage, 432, and a TLN data pipeline 442. The TLN address pipeline 430 further includes a TLN destination address generation logic unit 410, configuration & status registers (CSRs) 426, and a segment look-a-aside buffer (SLB) 452. Furthermore, the TLN destination address generation logic unit 410 includes an identification register (ID reg.) 412 and a compare logic unit 414.

The AGCU0 202 is coupled to act as an interface between the array 190 and the TLN 200. As shown, the AG 402 is coupled to receive an address from the array 190 via a signal 401, data from the array 190 as indicated by 403, and send data to the array 190 as indicated by 405. As shown, the addresses from the array 190 are queued in the AG address FIFO 404 and the data corresponding to the address from the array 190 is queued in the AG data FIFO 406. The AG data FIFO 406 is bidirectional and can also be used to queue the data coming from the TLN to the array 190. In general, the AG address 402 is operatively coupled to access certain TLN agents directly or indirectly specified by the addresses coming from the array 190 and send data to those TLN agents. It should be noted that the data here means any type of packets including request, data, response, and credit.

The following paragraphs will explain the reception and the translation of the addresses received from the array 190 to the TLN destination addresses. Initially, the address received from the array 190 can be a base address of an external device access request. Many such base addresses can be queued into the AG address FIFO 404. Each of the VAGs 408 receives a base address (BA 425) and further generates a virtual address VA 427 for the external device access. In order to generate the virtual address of the request from the base address, the VAGs may use internal logic (not shown) such as chain counters and datapath pipeline.

Virtual Address to Physical Address Mapping

The virtual address of the request generated by the VAG has to be mapped to a physical address before it can be sent to any TLN destination to further connect to an external device.

The runtime software (not shown) maps the compiler generated address to available physical memory through the process of VA-PA translation. This is needed to allow runtime to partition a large virtual address space into multiple physical address spaces which could be spread across multiple tiles. In one embodiment, the physical address space can be partitioned into segments where the minimum size of a segment is 1 MB, and the maximum size of a segment is 4 TB.

The virtual addresses VAs 427 are provided to the CU arbiter & mux 428, which selects a single virtual address via arbitration. In FIG. 4, the single virtual address is shown as VA 433, which is further provided to the SLB 452. The SLB 452 is operatively coupled to translate the virtual address VA 433 to a physical address PA 439 to be provided to the compare logic 414.

The SLB 452 may be programmed by the CSRs 426 and can hold the mapping information for multiple virtual segments. There can be a total of sixteen virtual segments. SLB 452 can of fully associative type and can be loaded from the bit-file during a program load operation (not shown). Each entry of SLB 452 can also be written through write operations to CSRs 426. It should be noted that the CSRs may include many other registers and buffers to help with the virtual to physical address translation, the details of which are not included here.

All of the above blocks and registers, SLB 452, and VAGs VAG0-VAG15 may operate sequentially or in parallel or in any suitable fashion.

The purpose of base address to virtual address to physical address translation is because the base address 401 received from the compiler. The base address BA 425 may be further split into multiple virtual addresses, each of which may be mapped to a physical address (PA) in an external device (memory or I/O) (e.g., actual address of a memory location), by a memory allocator (runtime). However, the memory allocator (such as a memory controller to which the external device is connected) may be connected to one of the TLN agents INFC agents (444-466) shown in the TLN 200 in FIG. 2. Therefore, in order to access that particular memory allocator, the TLN destination address may also need to be generated using the base address. This is implemented by the TLN destination address generating logic 410. The following paragraphs explain an example implementation of that.

First, the compare logic block 414 is configured to compare the PA 439 (partially or wholly) with the value of the ID register ID reg 412 to find out a request type and further generate a TLN destination address DA 429. The compare logic block 414 later provides both the PA 439 and DA 429 to the TLN request output stage 432. This is shown by (PA+DA) 431. The ID reg 412 may also be programmed by the CSRs 426. Although shown separately, the ID reg 412 and the SLB 452 may also be included in the CSRs 426. In the example shown, a plurality of bits of the physical address PA 439 are compared against the ID reg 412.

Second, based on the comparison, the external device access requests can be classified into three types as follows: if the plurality of bits of the PA 439 match the ID register 412, then the request is determined to be a local request. If the plurality of the bits of PA 439 match a specific predefined value, then the requests are identified as a Host Request. If the plurality of the bits of the PA 439 do not match the ID register, and do not match the specific predefined value, then it is determined to be a remote request.

Finally, if the request is identified as a remote request, then it is assigned one or more of the PCIe destinations (TLN agents 234-242). If the request is identified as a local request, then it is assigned one or more of the DDR destinations (TLN agents 244-266). If the request is identified as a host request, then it can be assigned to a dedicated host PCI destination, which can be one of the PCIe destinations (TLN agents 234-242). These requests can then be sent to the assigned TLN agents. However, the request may need to be further steered to a specific TLN agent out of the above mentioned TLN agents because that agent may be connected to the specific memory channel or channels where the physical address lies. This selection is implemented with the help of the configuration registers referred to as CSRs 426. The CSRs 426 can hold information regarding the number of memory channels connected to each TLN agent. The CSRs 426 may also include information about mapping of various memory channels, and mapping of various PCI-shims to the VAGs (VAG0-VAG15) 408. The CSRs 426 are programmed through a bit file as part of program load, or by runtime. In some embodiments, the compare logic block 414 can access the CSRs 426 to read any other registers needed for converting the physical address PA 439 to destination address DA 429. The CSRs 426 can also include a DDR-shim channel map register, a PCI-shim steering register, and a host PCI-shim ID register. All of these registers are used to further steer the memory or PCI requests to particular channels. If the CU 616 decodes the request as local or remote, it can provide that information to the AG 402 as well.

The CU arbiter & mux 428 is also operatively coupled to receive a low/high priority signal 437 VAG priority logic unit 416, which in turn is coupled to receive an input 441 from the TLN destination credit counters 434 and the destination address DA 429 from compare logic 414. TLN destination credit counters 434 are bidirectionally coupled to the TLN request output stage 432 as shown by the link 443 in FIG. 4 and may include a credit counter configured to count the E2E credits for each of the TLN destinations. Furthermore, each credit counter is configured to be incremented or decremented based on the credits used for a particular TLN agent. The maximum credits a VAG can have may be equal to the size of the internal FIFO of the TLN agent. For example, if the TLN agent 244 has a 32-entry FIFO, then the maximum credits a VAG can have while accessing the agent 244 is 32. First, the credit counter may be initialized to zero and it may be assumed that the agent 244's FIFO is empty. In this case a VAG can have a maximum number of credits available (in this example, as many as 32 credits available). Once the VAG accesses that TLN agent 244 once, the credit counter is configured to increment. Furthermore, when the TLN agent clears one or more entries from its FIFO (not shown), it can send an acknowledgement back to the AGCU and upon receiving the acknowledgement in the form of an E2E credit, the credit counter is configured to decrement. In such a case, if the credit counter reaches a value of 32, then it can be an indication that no more credits are available for the TLN agent 244. In other words, the actual credit counter value indicates the used up credits and the difference between the maximum credit counter value and the actual credit counter value indicates the available credits. In one embodiment, the TLN destination credit counter can be a saturating counter, meaning the counter will not roll over to zero after reaching 32.

In other embodiments, the credit counter can be initialized to a maximum value. In such as a case, after every access to a TLN agent, the credit counter is configured to decrement and after the TLN agent clears one entry from its FIFO and an acknowledgment is received by the AGCU in the form of E2E credits, the credit counter is configured to be incremented. In such a case, the actual credit counter value indicates the available credits and the difference between the maximum credit counter value and the actual credit counter value indicates the used up credits. There may be other logic included in the credit counters 434 which can reflect available credits for any TLN destination.

The available E2E credits for TLN destination are shared by all the VAGs equally. In simplest terms, this means that the available spaces in the internal FIFO of the TLN destination are shared by all the VAGs for sending data to. For example, if the AG0 402 is communicating with the TLN agent 244 and if the TLN agent 244 has initial 32 credits, then all those will be shared equally by the sixteen VAGs 408. Each VAG then can use one of the 32 credits for the TLN agent 244 when it wins the arbitration and gets a turn to access the TLN. However, as will be explained in greater detail below, if a VAG is identified as a credit-hog VAG, then it may not get access to the TLN agent as frequently as non-credit-hog VAGs even if there are credits available to access a particular TLN agent. In other words, a credit-hog VAG may be assigned a lower priority than non-credit-hog VAGs and may have to skip an arbitration cycle.

As will be explained in more details with respect to FIG. 5, the VAG priority logic unit 416 assigns a priority level to each of the VAGs 408 based on the TLN destination address DA 429 that it is trying to access. The VAG priority logic unit 416 further provides the assigned priority level for the particular VAG to the CU arbiter and mux unit 418. The CU arbiter & mux unit 418 then assigns the low or high priority to the particular VAG which had generated that VA initially and uses the priority for selecting it to be placed in the TLN request output stage 432.

To summarize, the VAGs VAG0-VAG15 generate virtual addresses VAs 427. The CU arbiter & mux 428 (which in one example can be a 16-way arbiter) selects one virtual address from one of the VAGs. For example, VAG0 may be selected by the CU arbiter and mux unit 428. The VA 433 may then be a virtual address requested by the VAG0. Once a physical address PA 439 and a destination address DA 429 is generated from that, the VAG priority logic unit 414 assigns priority level to the VAG0. If the priority level is low, then VAG0 will not be selected to enter the TLN request output stage 432. If the priority level is high, then the VAG0 will be selected to enter the TLN request output stage.

As shown, the CU 422 is coupled to receive or exchange address or data or both with both the AG 402 and AG1 432 as shown by signals data 417 and VAs 427. The following paragraphs will explain the reception and transmission of the data corresponding to the addresses received from the array 190. As can be seen, the AG data FIFO 406 can be filled with the incoming data which is further sent to the write buffers 424. The write buffers 424 can hold the incoming data from the AG 406 and provide that to the TLN data pipeline 442 as shown by the link 437. It should be noted that the data here means any type of packets including request, data, response, and credit that are being exchanged with the TLN. The buffers 424 can also hold the data coming from the TLN and going to the AG data FIFO 406 respectively.

The TLN request output stage 432 is further coupled to the TLN 200. There may be additional interfaces in between. As can be appreciated referring to the FIG. 2, the output of the TLN data I/F 415 is the link 261. The CU 422 can use the data I/F 415 to send and receive various packets including data, credit, request, and response packets to a TLN destination address indicated by the address I/F 413. The address indicated by the address I/F 413 may be the address of any of the TLN agents 232 to 266 and the physical address of a location in an external device (memory or host or both). In some embodiments, the TLN destination address may be sent as part of the data packet.

As will be explained with respect to FIG. 5, the VAG priority logic unit 416 is operatively coupled to work with the CU arbiter and mux unit 428 to assign a high or low priority the VAGs based on their identification as credit-hog VAGs or non-credit-hog VAGs.

Figure 5:
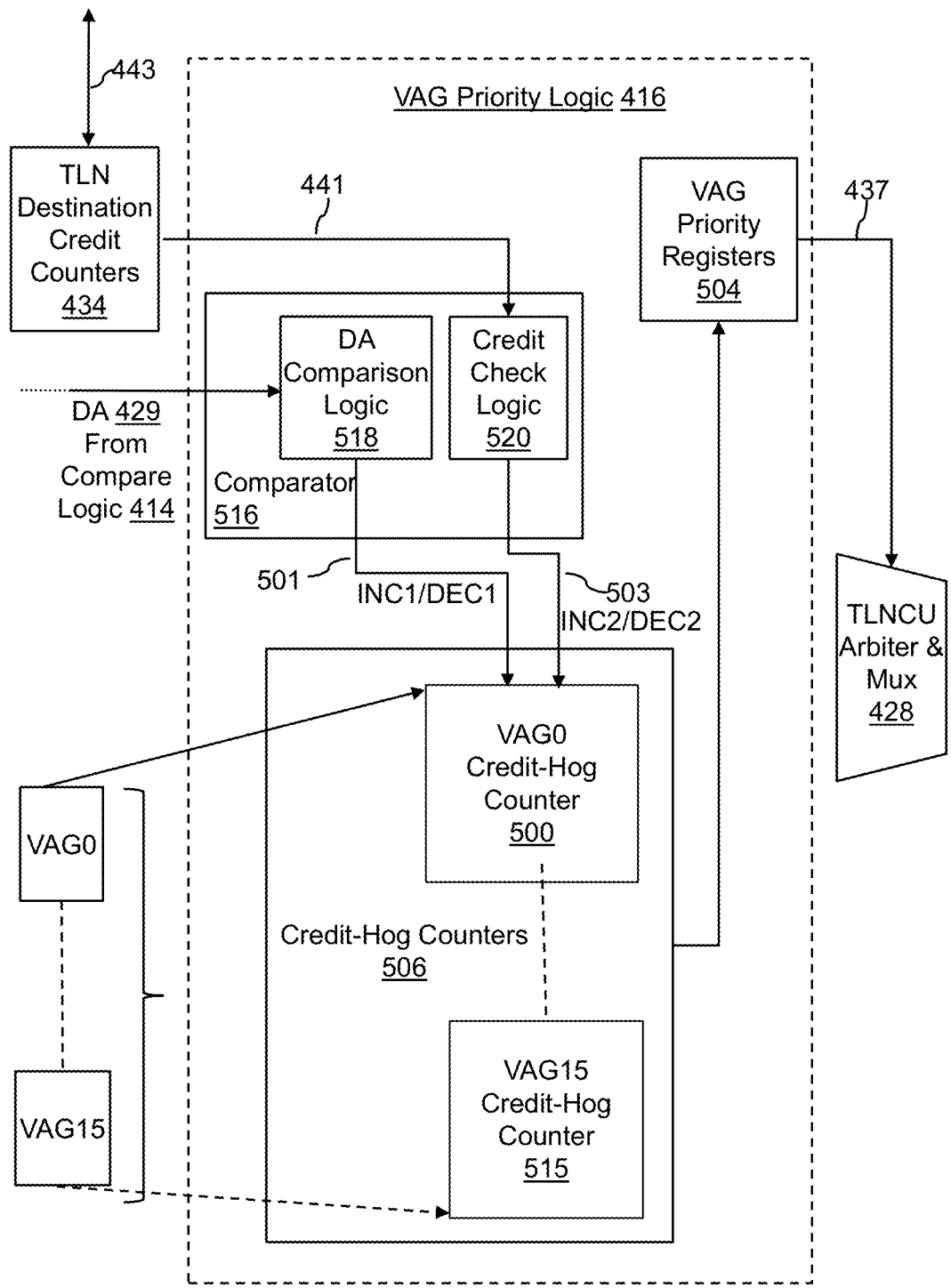
FIG. 5 illustrates an example block diagram including further example details of the AGCU of FIG. 4, according to an embodiment of the present disclosure.

FIG. 5 is a block diagram illustrating further example details of the VAG priority logic unit 416 included in the AG 402 included in the AGCU 202 shown in FIG. 4. As shown in FIG. 5, the VAG priority logic unit 416 receives an input from the TLN destination credit counters 434 and includes a VAG priority register 504, a credit-hog counter unit 506, and a comparator 516. The credit-hog counters 506 further includes credit-hog counters 500 to 515, one for each VAG from VAG0 through VAG15. Although shown as part of the VAG priority logic 416, the credit-hog counters 500-515 may be included in the VAGs 408.

As shown, the comparator 516 is coupled to receive an input 441 from the TLN destination credit counters 434 and the TLN destination address DA 429. The TLN destination credit counters 434 have the counts of the E2E credits for all the TLN destinations which are shared by all the VAGs. The credit-hog counters 506 block is coupled to receive an input from the comparator 516 as shown by the inc1/dec1 signal 501. As will be explained in the following paragraphs, the comparator 516 is operatively coupled to identify a VAG as a credit-hog VAG or a non-credit-hog VAG based on the inputs from the TLN destination credit counters 434 or the DA 429 or both.

More specifically, the comparator 516 may further include a destination address (DA) comparison logic 518 and a credit check logic 520. The DA comparison logic 518 is coupled to compare the TLN destination address DA 429 with the previous DA. If the DA 429 for a VAG is the same as the previous one (same over two consecutive TLN access cycles), then it may increment the VAG's credit-hog counter via the signal inc1/dec1 501. If the TLN DA 429 is different from the previous one (different over two consecutive TLN access cycles), then the comparator may decrement its credit-hog counter via the signal inc1/dec1 501. In other words, if the TLN destination address requested by a VAG is the same as the previous one, then its credit-hog counter is incremented. And if the TLN destination address requested by a VAG is the different from the previous one, then its credit-hog counter is decremented.

Similarly, the credit check logic 520 is operatively coupled to increment or decrement the credit-hog counter for a VAG based on the availability of credits for the TLN destination it is trying to access. As mentioned earlier, the TLN destination credit counters 434 keep track of each VAG's available credits for each TLN agent. Details about this have been explained with respect to the FIG. 3A.

Furthermore, in one embodiment, the credit check logic 520 is coupled to increment the credit-hog counter for a VAG based on its available credits for a particular TLN destination. If for a VAG, the available credits for a particular TLN destination is lower than a predefined threshold, then the credit-hog counter for the VAG is incremented via the signal inc2/dec2 503 otherwise the credit-hog counter is decremented via the signal inc2/dec2 503. In other embodiments, if the total credits used by VAG for a particular TLN agent is higher than a threshold, then the credit-hog counter for the VAG is incremented otherwise it is decremented. The incrementing or decrementing of the credit-hog counter may be implemented in any suitable fashion in other embodiments.

In one embodiment, if the value of the credit-hog value for a VAG is zero (or some other predefined first range), the VAG is not identified as a credit-hog. But if the value of the credit-hog counter for the VAG is greater than zero (or some other pre-defined second range), then that VAG is identified as a credit-hog VAG. For example, in the FIG. 5, if the value of the VAG0 credit-hog counter 508 is greater than zero (i.e., a second range), then the VAG0 will be identified as a credit-hog VAG. Once a VAG is identified as a credit-hog VAG, it may be assigned a lower priority of selection by the VAG priority register. This is explained in more details in the following paragraph.

As shown, the VAG priority register 504 is coupled to receive an input from the credit-hog counters 506 to further assign a priority level to each VAG. The priority level is assigned in response to the VAG being identified as a credit-hog VAG or a non-credit-hog VAG, which in turn is decided by the value of the VAG's credit-hog counter being in a second range or a first range, respectively. The VAG whose credit-hog counter has a value in the second range (e.g., greater than zero), is assigned a lower priority level. The VAG whose credit-hog counter has a value in the first range (e.g., equal to zero), is assigned a higher priority level. The priority level is then received by the CU arbiter & mux 428, which assigns a lower priority in arbitration to a credit-hog VAG as compared to a non-credit-hog VAG. Referring back to the FIG. 4, if the VAG0 is identified as a credit-hog-VAG, then it may be placed in the TLN request output stage 432 less frequently or may not be placed in the output stage at all.

In other words, the credit-hog VAG may be assigned a fewer number of TLN access cycles compared to a non-credit-hog VAG or it may be placed in the AG0 output pipeline 420 at the very end or may not even be placed in the pipeline in some cases. This is explained in further details below.

In general, there can be sixteen arbitration cycles in one TLN access operation. Initially, these sixteen arbitration cycles are shared by all the VAGs equally. This 16-cycle period is used to categorize cycles into two types: high-priority cycles and low-priority cycles. A programmable register is used to adjust the ratio between these two cycle types. Referring to FIG. 4, the high/low priority signal 437 is fed into the CU arbiter & mux unit 428 and effects the arbiter's operation. During high-priority cycles only high-priority (non-credit-hog) VAGs may be selected. During low-priority cycles, all VAGs requesting to participate in arbitration are allowed to be selected, but low-priority (credit-hog) VAGs are given higher priority. This can be thought of artificially throttling low-priority(credit hog) to reduce head-of-line blocking at the TLN output interface, by only allowing those VAGs to participate in a smaller fraction of the cycles.

Thus, according to one embodiment, if a VAG is identified as a credit-hog VAG, then that VAG is selected for fewer number of cycles than a non-credit hog VAG. In other words, a credit-hog VAG may skip one or more arbitration cycles or not win arbitration even if no other VAG is being selected in a particular arbitration cycle. Furthermore, if no VAGs are available for arbitration, either because no VAG is requesting to participate in arbitration, or only credit-hog VAGs are requesting arbitration and credit-hog VAGs are not allowed in that particular cycle, then no VAG is selected for that arbitration cycle. Instead, an empty TLN request may be into the AG output pipeline that may not perform any operation. Those skilled in the art may appreciate that such as cycle may be similar to a no-operation (NOP) cycle.

In one embodiment, many instances of the reconfigurable processor (RDP) 110 may be used as part of a Linux based software system. The RDPs may provide an underlying hardware which interacts with a Linux based kernel which may further interact with a PCIe fabric. In such cases, the Linux kernel is configured to map the RDPs into the host's physical memory address space. Write and read operations to these physical addresses include accesses to the CSRs in various RDPs. Furthermore, in such systems, a driver may be used to make a system call to expose a subsection of the physical memory address space to allocate a graph in a user space. This then results in a virtual address space being allocated for a graph or one or more processes in the graph. Additionally, such a system may involve a resource allocation phase during which the runtime examines the memory segments required by each graph and assigns virtual and physical addresses to them, working with the Linux kernel. Depending on the specification of the segment type, physical memory can be allocated in host memory or RDP memory. This leads to the SLB being programmed with the (virtual, physical) address mapping so the graph running on the accelerator can access the appropriate segment wherever it resides.

Aspects of various embodiments are described with reference to flowchart illustrations and/or block diagrams of methods, apparatus, systems, and computer program products according to various embodiments disclosed herein. It will be understood that various blocks of the flowchart illustrations and/or block diagrams, and combinations of blocks in the flowchart illustrations and/or block diagrams, can be implemented by computer program instructions or by configuration information for a Field-Programmable Gate Array (FPGA) of Course-Grained Reconfigurable Architecture Integrated Circuit (CGRA IC). These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. Similarly, the configuration information for the FPGA/CGRA IC may be provided to the FPGA/CGRA IC and configure the FPGA/CGRA IC to produce a machine which creates means for implementing the functions/acts specified in the flowchart and/or block diagram block or blocks.

These computer program instructions or FPGA/CGRA IC configuration information may be stored in a computer readable medium that can direct a computer, other programmable data processing apparatus, FPGA/CGRA IC, or other devices to function in a particular manner, such that the data stored in the computer readable medium produce an article of manufacture including instructions which implement the function/act specified in the flowchart and/or block diagram block or blocks. The computer program instructions or FPGA/CGRA IC configuration information may also be loaded onto a computer, FPGA/CGRA IC, other programmable data processing apparatus, or other devices to cause a series of operational steps to be performed on the computer, FPGA/CGRA IC, other programmable apparatus, or other devices to produce a computer implemented process for implementing the functions/acts specified in the flowchart and/or block diagram block or blocks.

The flowchart and/or block diagrams in the figures help to illustrate the architecture, functionality, and operation of possible implementations of systems, methods and computer program products of various embodiments. In this regard, each block in the flowchart or block diagrams may represent a module, segment, or portion of code comprising one or more executable instructions, or a block of circuitry, for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 6:
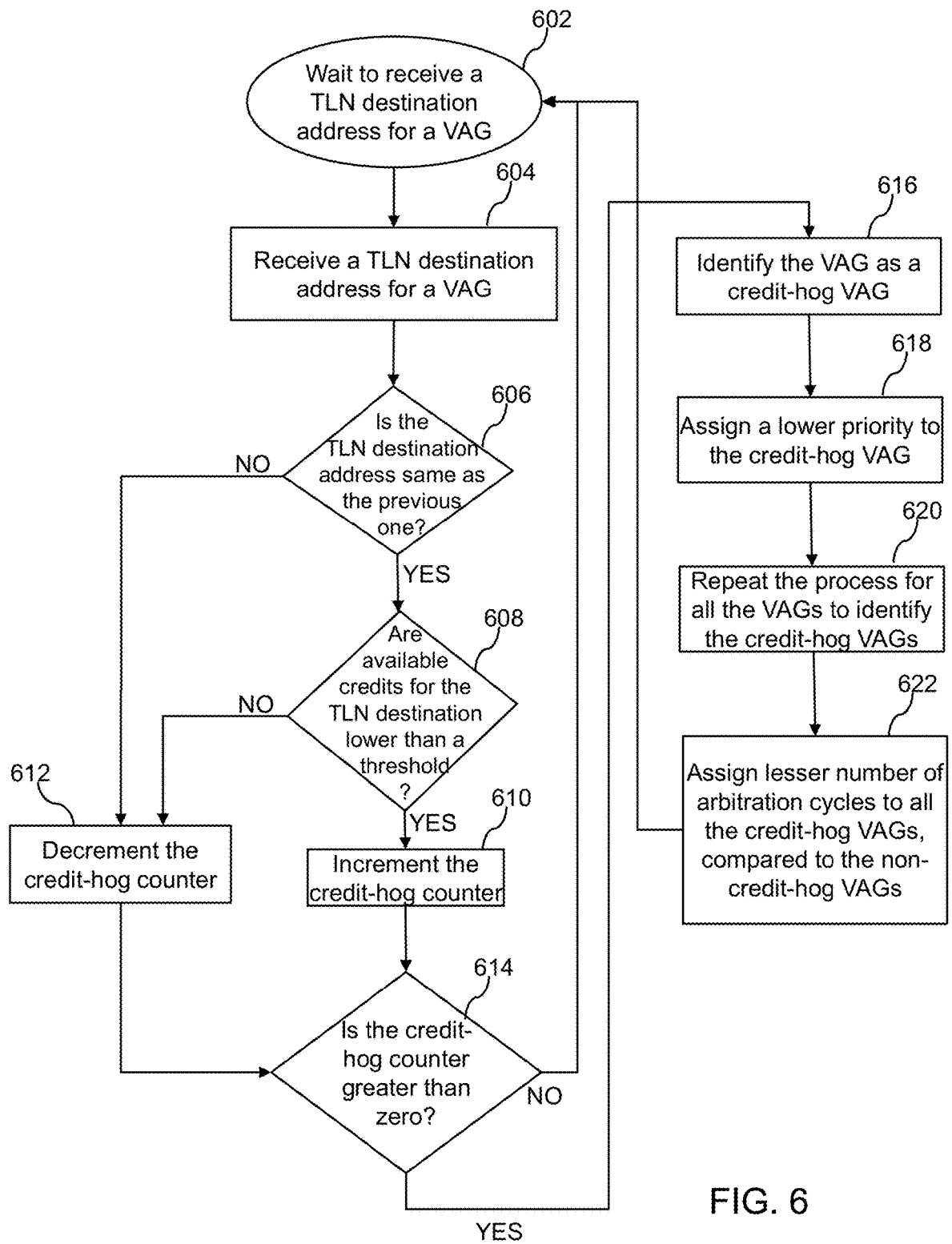
FIG. 6 is a flow diagram illustrating an example method to arbitrate for a network in a coarse-grained reconfigurable (CGR) processor.

FIG. 6 is a flow diagram illustrating an example method to arbitrate for a first network in a coarse-grained reconfigurable (CGR) processor. As shown, the method may start at step 602 by waiting to receive a TLN destination address for a VAG.

At step 604, a TLN destination for the VAG may be received. The TLN destination address determined by comparing a request address generated by a VAG and an ID register. An example of this is shown in FIG. 4. The AG0 402 and AG1 432 can receive a base addresses 401 and 407 respectively from the array 190. The VAGs generate a virtual address using the base address. The virtual address is compared with the ID register 412 (or a register in the CSRs 426) and a TLN destination addresses 429 is generated based on the comparison. Then the method may proceed to step 606.

At step 606, it may be checked if the current TLN destination address same as the previous TLN destination address from that VAG. For example, in FIG. 5, the comparator 516 checks if the current destination address is same as the previous one. If so, then the method may proceed to step 608. If not, then the method may proceed to step 612.

At step 608, it may be checked if the available credits for the TLN destination are lower than a threshold. This may check to see if the credit counter is greater than or less than a threshold value depending on whether the credit counter shows the number of credits used, or the number of credits available. If there are fewer credits for that TLN destination than the predetermined threshold, then the method may proceed to step 610. If not, then the method may proceed to step 612. For example, in FIG. 5, the TLN destination credit counters 434 check the available credits for a particular TLN destination.

Note that step 606 and 608 may take place in parallel and that for each address received from a VAG, it's credit-hog counter is either incremented or decremented only once.

At step 610, a credit-hog counter may be incremented. For example, this is shown by the inc1 and inc2 signals 501 and 503 respectively. Note that the credit-hog counter for the VAG will only be incremented if both the inc1 signal 501 and inc2 signal 503 are true meaning that both the condition checked at step 606 (TLN destination address the same as the previous TLN destination from that VAG) and the condition checked at step 608 (available credits for the TLN destination lower than a threshold) are true. The method may then proceed to step 614.

At step 612, the credit-hog counter may be decremented. For example, this is shown by the dec1/dec2 signals 501 and 503, respectively. Thus, the credit-hog counter is decremented if either the condition checked at step 606 (TLN destination address the same as the previous TLN destination from that VAG) and the condition checked at step 608 (available credits for the TLN destination lower than a threshold) is false. The method may then proceed to step 614.

At step 614, it may be checked if the credit-hog counter is in a second range (e.g., greater than zero). If so, then the method may proceed to step 616. If not (e.g., the credit-hog counter is in a first range, such as equal to 0), then the method may return to step 602 where it may wait to receive another TLN destination address for a VAG.

At step 616 the VAG may be identified as a credit-hog VAG. An example of this is mentioned with respect to credit-hog counters unit 506 in FIG. 5. The method may then proceed to step 618.

At step 618, a lower priority may be assigned to the credit-hog VAG. For example, in FIG. 5, the VAG priority registers assign a lower priority to VAG0. The method may then proceed to step 620.

As shown at step 620, the above process may be repeated for all the VAGs and all the credit-hog VGAs may be identified. For example, referring back to FIG. 5, the VAGs VAG0 to VAG15 may be separated into credit-hog VAGs and non-credit-hog VAGs.

At step 622, a lesser number of arbitration cycles may be assigned to the credit-hog VAGs together compared to the non-credit-hog VAGs. For example, it may be assumed that there are 10 arbitration cycles for an AGCU. If it is further assumed that VAG0 to VAG7 are credit-hog VAGs and VAG8 to VAG15 are non-credit-hog VAGs, then out of 10 arbitration cycles, the VAGs VAG0 to VAG7 may be assigned to only 5 arbitration cycles. On the other hand, the non-credit-VAGs are assigned to all 10 arbitration cycles.

At the end of step 622, the method may return to step 602, where it may wait to receive another TLN destination address for a VAG.

As will be appreciated by those of ordinary skill in the art, aspects of the various embodiments may be embodied as a system, device, method, or computer program product apparatus. Accordingly, elements of the present disclosure may take the form of an entirely hardware embodiment, an entirely software embodiment (including firmware, resident software, micro-code, or the like) or an embodiment combining software and hardware aspects that may all generally be referred to herein as a "apparatus," "server,", "circuitry," "module," "client," "computer," "logic," "FPGA," "CGRA IC," "system," or other terms. Furthermore, aspects of the various embodiments may take the form of a computer program product embodied in one or more computer-readable medium(s) having computer program code stored thereon. The phrases "computer program code" and "instructions" both explicitly include configuration information for an FPGA/CGRA IC or other programmable logic as well as traditional binary computer instructions, and the term "processor" explicitly includes logic in an FPGA/CGRA IC or other programmable logic configured by the configuration information in addition to a traditional processing core, such as one in a central processing unit (CPU) or graphics processing unit (GPU). Furthermore, "executed" instructions explicitly includes electronic circuitry of an FPGA/CGRA IC or other programmable logic performing the functions for which they are configured by configuration information loaded from a storage medium as well as serial or parallel execution of instructions by a traditional processing core.

Any combination of one or more computer-readable storage medium(s) may be utilized. A computer-readable storage medium may be embodied as, for example, an electronic, magnetic, optical, electromagnetic, infrared, or semiconductor system, apparatus, or device, or other like storage devices known to those of ordinary skill in the art, or any suitable combination of computer-readable storage mediums described herein. In the context of this document, a computer-readable storage medium may be any tangible medium that can contain or store a program and/or data for use by or in connection with an instruction execution system, apparatus, or device. Even if the data in the computer-readable storage medium requires action to maintain the storage of data, such as in a traditional semiconductor-based dynamic random access memory, the data storage in a computer-readable storage medium can be considered to be non-transitory. A computer data transmission medium, such as a transmission line, a coaxial cable, a radio-frequency carrier, and the like, may also be able to store data, although any data storage in a data transmission medium can be said to be transitory storage. Nonetheless, a computer-readable storage medium, as the term is used herein, does not include a computer data transmission medium.

Computer program code for carrying out operations for aspects of various embodiments may be written in any combination of one or more programming languages, including object oriented programming languages such as Java, Python, C++, or the like, conventional procedural programming languages, such as the "C" programming language or similar programming languages, or low-level computer languages, such as assembly language or microcode. In addition, the computer program code may be written in Verilog, VHDL or another hardware description language to generate configuration instructions for an FPGA/CGRA IC or other programmable logic. The computer program code if converted into an executable form and loaded onto a computer, FPGA/CGRA IC, or other programmable apparatus, produces a computer implemented method. The instructions which execute on the computer, FPGA/CGRA IC, or other programmable apparatus may provide the mechanism for implementing some or all of the functions/acts specified in the flowchart and/or block diagram block or blocks. In accordance with various implementations, the computer program code may execute entirely on the user's device, partly on the user's device and partly on a remote device, or entirely on the remote device, such as a cloud-based server. In the latter scenario, the remote device may be connected to the user's device through any type of network, including a local area network (LAN) or a wide area network (WAN), or the connection may be made to an external computer (for example, through the Internet using an Internet Service Provider). The computer program code stored in/on (i.e., embodied therewith) the non-transitory computer-readable medium is comprised by an article of manufacture.

The computer program code, if executed by a processor, causes physical changes in the electronic devices of the processor which change the physical flow of electrons through the devices. This alters the connections between devices which changes the functionality of the circuit. For example, if two transistors in a processor are wired to perform a multiplexing operation under control of the computer program code, if a first computer instruction is executed, electrons from a first source flow through the first transistor to a destination, but if a different computer instruction is executed, electrons from the first source are blocked from reaching the destination, but electrons from a second source are allowed to flow through the second transistor to the destination. So, a processor programmed to perform a task is transformed from what the processor was before being programmed to perform that task, much like a physical plumbing system with different valves can be controlled to change the physical flow of a fluid.

Examples of various embodiments are described in the following paragraphs:

Example 1. A coarse-grained reconfigurable (CGR) processor comprising: a first network and a second network; a plurality of agents coupled to the first network; an array of CGR units coupled together by the second network; and a tile agent coupled between the first network and the second network, the tile agent comprising: a plurality of links; a plurality of credit counters associated with respective agents of the plurality of agents; a plurality of credit-hog counters associated with respective links of the plurality of links; and an arbiter to manage access to the first network from the plurality of links based their associated credit-hog counters; wherein a credit-hog counter of the plurality of credit-hog counters changes in response to processing a request for a transaction from its associated link.

In the CGR processor of example 1, the first network may be a top-level network (TLN); the second network may be an array level network (ALN); units of the CGR units may include a reconfigurable processor units, reconfigurable memory units, switches, and/or an address generation and coalescing unit (AGCU); the tile agent may be an AGCU; the plurality of agents may include one or more of an agent for a Peripheral Component Interconnect Express (PCIe) interface (a Pshim), an agent for a memory controller (a Mshim or Hshim), or an AGCU of another array of CGR units; and the plurality of links may be virtual address generators (VAGs).

Example 2. The CGR processor of example 1, the arbiter configured to provide a first level of bandwidth on the first network to a first link of the plurality of links in response to its associated credit-hog counter having a value in a first range, and to provide a second level of bandwidth on the first network to a second link of the plurality of links in response to its associated credit-hog counter having a value in a second range, wherein the first level of bandwidth is higher than the second level of bandwidth.

Example 3. The CGR processor of example 1, further comprising circuitry to assign a first priority to a first set of links of the plurality of links having values of their associated credit-hog counters in a first range and to assign a second priority to a second set of links of the plurality of links having values of their associated credit-hog counters in a second range; and the arbiter including the first set of links in a first percentage of arbitration cycles for the first network and including the second set of links in a second percentage of arbitration cycles for the first network that is lower than the first percentage.

Example 4. The CGR processor of example 3, wherein a link is included in the first set of links or the second set of links only if it has a pending transaction and a credit counter associated with a destination agent for the pending transaction indicates that credits are available.

Example 5. The CGR processor of example 3, further comprising a low priority ratio register, wherein the second percentage is set based on a value set in the low priority ratio register.

Example 6. The CGR processor of example 5, wherein the first percentage is 100% and the second percentage is determined by a ratio of the value set in the low priority ratio register to 16.

Example 7. The CGR processor of example 1, further comprising circuitry to change credit-hog counters of the plurality of credit-hog counters, the circuitry configured to decrement the credit-hog counter associated with a particular link of the plurality of links in response to the processing of the request to an agent of the plurality of agents from the particular link unless it is incremented in response the processing of the request because an immediately prior request from the particular link was to the same agent and the credit counter associated with the agent indicates that less than a predetermined threshold of credits are available.

Example 8. The CGR processor of claim example 7, wherein the plurality of credit counters and the plurality of credit-hog counters are saturating counters that do not change when decremented while having a value of all zeros or when incremented while having a value of all ones.

Example 9. The CGR processor of example 8, the arbiter configured to provide a first level of bandwidth on the first network to a first link of the plurality of links in response to its respective credit-hog counter having a value less than or equal to a credit-hog threshold, and to provide a second level of bandwidth on the first network to a second link of the plurality of links in response to its respective credit-hog counter having a value greater than the credit-hog threshold, wherein the first level of bandwidth is higher than the second level of bandwidth.

Example 10. The CGR processor of example 9, wherein the credit-hog threshold is 0.

Example 11. The CGR processor of example 10, further comprising a low priority ratio register; and the arbiter configured to perform R low priority arbitration cycles and N-R high priority arbitration cycles out of a group of N arbitration cycles, where R is a value retrieved from the low priority ratio register and N is a predetermined constant.

Example 12. The CGR processor of example 1, the plurality of links in the tile agent including a first link and a second link; the plurality of credit counters in the tile agent including a first credit counter associated with a first agent of the plurality of agents and a second credit counter associated with a second agent of the plurality of agents; wherein the first credit counter is initialized to zero, incremented in response to sending a first transaction from a link of the plurality of links to the first agent over the first network, and decremented in response to receiving a token from the first agent on a credit network of the first network; and the second credit counter is initialized to zero, incremented in response to sending a second transaction from a link of the plurality of links to the second agent over the first network, and decremented in response to receiving a token from the second agent on the credit network of the first network.

Example 13. The CGR processor of example 12, wherein the first credit counter comprises a first request network credit counter, the first transaction and the second transaction are sent over a request network of the first network and the credit from the first agent and the credit from the second agent are end-to-end request credits.

Example 14. A method to arbitrate for a first network in a coarse-grained reconfigurable (CGR) processor that includes the first network and a second network, a plurality of agents coupled to the first network, an array of CGR units coupled together by the second network, and a tile agent coupled between the first network and the second network, the tile agent having a plurality of links, a plurality of credit-hog counters associated with respective links of the plurality of links, and an arbiter to manage access to the first network from the plurality of links, the method comprising: queueing a request for a first transaction on the first network from a first link in the plurality of links, wherein a value of a first credit-hog counter of the plurality of credit-hog counters associated with the first link is in a first range; queueing a request for a second transaction on the first network from a second link in the plurality of links, wherein a value of a second credit-hog counter of the plurality of credit-hog counters associated with the second link is in a second range; performing a high priority arbitration cycle, by the arbiter, that includes the first transaction request in the high priority arbitration cycle based on the value of the first credit-hog counter being in the first range and excludes the second transaction request based on the value of the second credit-hog counter being in the second range; performing a low priority arbitration cycle, by the arbiter, that includes both the first transaction request and the second transaction request in the low priority arbitration cycle independent of the value of the first credit-hog counter and the value of the second credit-hog counter; updating the first credit-hog counter upon processing a request for a transaction on the first network from the first link; and updating the second credit-hog counter upon processing a request for a transaction on the first network from the second link.

Example 15. The method of example 14, wherein updating a particular credit-hog counter, including the first credit-hog counter and the second credit-hog counter, comprises: incrementing the particular credit-hog counter associated with a particular link of the plurality of links upon processing a second of two consecutive requests from the particular link to a single agent of the plurality of agents while a credit counter associated with the single agent indicates fewer than a predetermined threshold of credits are available; decrementing the particular credit-hog counter upon processing the second of two consecutive requests from the particular link to the single agent of the plurality of agents while the credit counter associated with the single agent indicates a number of available credits greater than or equal to the predetermined threshold; and decrementing the particular credit-hog counter upon processing a request from the particular link that is not the second of two consecutive requests; wherein the particular credit-hog counter is a saturating counter that does not change when decremented while having a value of all zeros or when incremented while having a value of all ones.

Example 16. The method of example 14, the tile agent including a plurality of credit counters associated with respective agents of the plurality of agents, the method further comprising: initializing a particular credit counter of the plurality of credit counters to zero; incrementing the particular credit counter in response to sending a transaction from a link of the plurality of links to a particular agent of the plurality of agents associated with the particular credit counter over the first network; and decrementing the particular credit counter in response to receiving a credit from the particular agent on a credit network of the first network.

Example 17. The method of example 14, further comprising: receiving, in a low priority ratio register, a low priority count value R; and performing, by the arbiter, a predetermined number of arbitration cycles N, where R of the N arbitration cycles are low priority arbitration cycles and N-R of the N arbitration cycles are high priority arbitration cycles.

Example 18. The method of example 17, wherein N is 16 and R is 8 or less.

Example 19. The method of example 14, wherein the first range is 0 and the second range is 1 to a maximum value of a credit-hog counter of the plurality of credit-hog counters.

Example 20. The method of example 14, further comprising: including a transaction request from a link of the plurality of links in a high priority arbitration cycle only if a credit counter associated a destination agent of the transaction request shows that credits are available.

Unless otherwise indicated, all numbers expressing quantities, properties, measurements, and so forth, used in the specification and claims are to be understood as being modified in all instances by the term "about." The recitation of numerical ranges by endpoints includes all numbers subsumed within that range, including the endpoints (e.g., 1 to 5 includes 1, 2.78, 7C, 3.33, 4, and 5).

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described example embodiments but should be defined only in accordance with the following claims and equivalents thereof.

We claim as follows:

1. A coarse-grained reconfigurable (CGR) processor comprising:
    a first network and a second network;
    a plurality of agents coupled to the first network;
    an array of CGR units coupled together by the second network; and
    a tile agent coupled between the first network and the second network, the tile agent comprising:
        a plurality of links;
        a plurality of credit counters associated with respective agents of the plurality of agents;
        a plurality of credit-hog counters associated with respective links of the plurality of links, including a first credit-hog counter and a second credit-hog counter; and
        an arbiter to manage access to the first network from the plurality of links based their associated credit-hog counters and to perform a high priority arbitration cycle that includes a first transaction request based on a value of the first credit-hog counter and excludes a second transaction request based on a value of the second credit-hog counter, and a low priority arbitration cycle that includes both the first transaction request and the second transaction independent of the value of the first credit-hog counter and the value of the second credit-hog counter;
    wherein a credit-hog counter of the plurality of credit-hog counters changes in response to processing a request for a transaction from its associated link,
    and
        an arbiter to manage access of the first network from the plurality of links based their associated credit-hog counters.

2. The CGR processor of claim 1, the arbiter configured to provide a first level of bandwidth on the first network to a first link of the plurality of links in response to its associated credit-hog counter having a value in a first range, and to provide a second level of bandwidth on the first network to a second link of the plurality of links in response to its associated credit-hog counter having a value in a second range, wherein the first level of bandwidth is higher than the second level of bandwidth.

3. The CGR processor of claim 1, further comprising circuitry to assign a first priority to a first set of links of the plurality of links having values of their associated credit-hog counters in a first range and to assign a second priority to a second set of links of the plurality of links having values of their associated credit-hog counters in a second range; and
    the arbiter including the first set of links in a first percentage of arbitration cycles for the first network and including the second set of links in a second percentage of arbitration cycles for the first network that is lower than the first percentage.

4. The CGR processor of claim 3, wherein a link is included in the first set of links or the second set of links only if it has a pending transaction and a credit counter associated with a destination agent for the pending transaction indicates that credits are available.

5. The CGR processor of claim 3, further comprising a low priority ratio register, wherein the second percentage is set based on a value set in the low priority ratio register.

6. The CGR processor of claim 5, wherein the first percentage is 100% and the second percentage is determined by a ratio of the value set in the low priority ratio register to 16.

7. The CGR processor of claim 1, further comprising circuitry to change credit-hog counters of the plurality of credit-hog counters, the circuitry configured to decrement the credit-hog counter associated with a particular link of the plurality of links in response to the processing of the request to an agent of the plurality of agents from the particular link unless it is incremented in response the processing of the request because an immediately prior request from the particular link was to the same agent and the credit counter associated with the agent indicates that less than a predetermined threshold of credits are available.

8. The CGR processor of claim 7, wherein the plurality of credit counters and the plurality of credit-hog counters are saturating counters that do not change when decremented while having a value of all zeros or when incremented while having a value of all ones.

9. The CGR processor of claim 8, the arbiter configured to provide a first level of bandwidth on the first network to a first link of the plurality of links in response to its respective credit-hog counter having a value less than or equal to a credit-hog threshold, and to provide a second level of bandwidth on the first network to a second link of the plurality of links in response to its respective credit-hog counter having a value greater than the credit-hog threshold, wherein the first level of bandwidth is higher than the second level of bandwidth.

10. The CGR processor of claim 9, wherein the credit-hog threshold is 0.

11. The CGR processor of claim 10, further comprising a low priority ratio register; and the arbiter configured to perform R low priority arbitration cycles and N-R high priority arbitration cycles out of a group of N arbitration cycles, where R is a value retrieved from the low priority ratio register and N is a predetermined constant.

12. The CGR processor of claim 1, the plurality of links in the tile agent including a first link and a second link;
the plurality of credit counters in the tile agent including a first credit counter associated with a first agent of the plurality of agents and a second credit counter associated with a second agent of the plurality of agents;
wherein the first credit counter is initialized to zero, incremented in response to sending a first transaction from a link of the plurality of links to the first agent over the first network, and decremented in response to receiving a token from the first agent on a credit network of the first network; and
the second credit counter is initialized to zero, incremented in response to sending a second transaction from a link of the plurality of links to the second agent over the first network, and decremented in response to receiving a token from the second agent on the credit network of the first network.

13. The CGR processor of claim 12, wherein the first credit counter comprises a first request network credit counter, the first transaction and the second transaction are sent over a request network of the first network and the token from the first agent and the token from the second agent represent end-to-end request credits.

14. A method to arbitrate for a first network in a coarse-grained reconfigurable (CGR) processor that includes the first network and a second network, a plurality of agents coupled to the first network, an array of CGR units coupled together by the second network, and a tile agent coupled between the first network and the second network, the tile agent having a plurality of links, a plurality of credit-hog counters associated with respective links of the plurality of links, and an arbiter to manage access to the first network from the plurality of links, the method comprising:
queueing a request for a first transaction on the first network from a first link in the plurality of links, wherein a value of a first credit-hog counter of the plurality of credit-hog counters associated with the first link is in a first range;
queueing a request for a second transaction on the first network from a second link in the plurality of links, wherein a value of a second credit-hog counter of the plurality of credit-hog counters associated with the second link is in a second range;
performing a high priority arbitration cycle, by the arbiter, that includes the first transaction request in the high priority arbitration cycle based on the value of the first credit-hog counter being in the first range and excludes the second transaction request based on the value of the second credit-hog counter being in the second range;
performing a low priority arbitration cycle, by the arbiter, that includes both the first transaction request and the second transaction request in the low priority arbitration cycle, independent of the value of the first credit-hog counter and the value of the second credit-hog counter;
updating the first credit-hog counter upon processing a request for a transaction on the first network from the first link; and
updating the second credit-hog counter upon processing a request for a transaction on the first network from the second link.

15. The method of claim 14, wherein updating a particular credit-hog counter, including the first credit-hog counter and the second credit-hog counter, comprises:
incrementing the particular credit-hog counter associated with a particular link of the plurality of links upon processing a second of two consecutive requests from the particular link to a single agent of the plurality of agents while a credit counter associated with the single agent indicates fewer than a predetermined threshold of credits are available;
decrementing the particular credit-hog counter upon processing the second of two consecutive requests from the particular link to the single agent of the plurality of agents while the credit counter associated with the single agent indicates a number of available credits greater than or equal to the predetermined threshold; and
decrementing the particular credit-hog counter upon processing a request from the particular link that is not the second of two consecutive requests;
wherein the particular credit-hog counter is a saturating counter that does not change when decremented while having a value of all zeros or when incremented while having a value of all ones.

16. The method of claim 14, the tile agent including a plurality of credit counters associated with respective agents of the plurality of agents, the method further comprising:
initializing a particular credit counter of the plurality of credit counters to zero;
incrementing the particular credit counter in response to sending a transaction from a link of the plurality of links to a particular agent of the plurality of agents associated with the particular credit counter over the first network; and
decrementing the particular credit counter in response to receiving a credit from the particular agent on a credit network of the first network.

17. The method of claim 14, further comprising:
receiving, in a low priority ratio register, a low priority count value R; and
performing, by the arbiter, a predetermined number of arbitration cycles N, where R of the N arbitration cycles are low priority arbitration cycles and N-R of the N arbitration cycles are high priority arbitration cycles.

18. The method of claim 17, wherein N is 16 and R is 8 or less.

19. The method of claim 14, wherein the first range is 0 and the second range is 1 to a maximum value of a credit-hog counter of the plurality of credit-hog counters.

20. The method of claim 14, further comprising:
including a transaction request from a link of the plurality of links in a high priority arbitration cycle only if a credit counter associated a destination agent of the transaction request shows that credits are available.

\* \* \* \* \*